(12) United States Patent
Choi et al.

(10) Patent No.: US 7,960,220 B2
(45) Date of Patent: Jun. 14, 2011

(54) METHOD OF FORMING POLYSILICON, THIN FILM TRANSISTOR USING THE POLYSILICON, AND METHOD OF FABRICATING THE THIN FILM TRANSISTOR

(75) Inventors: Jun-Hee Choi, Yongin-si (KR); Andrei Zoulkarneev, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 796 days.

(21) Appl. No.: 11/882,725

(22) Filed: Aug. 3, 2007

(65) Prior Publication Data

US 2008/0164475 A1 Jul. 10, 2008

(30) Foreign Application Priority Data

Jan. 10, 2007 (KR) .................. 10-2007-0003070

(51) Int. Cl.
*H01L 21/00* (2006.01)
*H01L 21/84* (2006.01)
*H01L 21/20* (2006.01)

(52) U.S. Cl. ........ 438/158; 438/149; 438/166; 438/488; 257/E21.133

(58) Field of Classification Search ........... 257/E21.133; 438/151, 149, 166, 479, 488, 158
See application file for complete search history.

(56) References Cited

U.S. PATENT DOCUMENTS

| 6,297,080 | B1 * | 10/2001 | Lee et al. ........... 438/151 |
| 6,309,951 | B1 * | 10/2001 | Jang et al. ......... 438/486 |
| 6,342,409 | B1 * | 1/2002 | Seo ............. 438/161 |
| 6,541,323 | B2 * | 4/2003 | Yang et al. ......... 438/200 |
| 6,558,986 | B1 * | 5/2003 | Choi ............ 438/149 |
| 6,614,054 | B1 * | 9/2003 | Ahn ............ 257/72 |
| 2004/0203218 | A1 * | 10/2004 | Kim et al. ......... 438/482 |
| 2006/0292726 | A1 * | 12/2006 | Akimoto et al. ....... 438/30 |

* cited by examiner

*Primary Examiner* — Shouxiang Hu
(74) *Attorney, Agent, or Firm* — Harness, Dickey & Pierce, PLC

(57) ABSTRACT

A method of forming polysilicon, a thin film transistor (TFT) using the polysilicon, and a method of fabricating the TFT are disclosed. The method of forming the polysilicon comprises: forming an insulating layer on a substrate; forming a first electrode and a second electrode on the insulating layer; forming at least one heater layer on the insulating layer so as to connect the first electrode and the second electrode; forming an amorphous material layer containing silicon on the heater layer(s); forming a through-hole under the heater layer(s) by etching the insulating layer; and crystallizing the amorphous material layer into a polysilicon layer by applying a voltage between the first electrode and the second electrode so as to heat the heater layer(s).

7 Claims, 22 Drawing Sheets

METHOD OF FORMING POLYSILICON, THIN FILM TRANSISTOR USING THE POLYSILICON, AND METHOD OF FABRICATING THE THIN FILM TRANSISTOR

CLAIM OF PRIORITY

This application makes reference to, incorporates the same herein, and claims all benefits accruing under 35 U.S.C.§119 from an application for METHOD OF FORMING POLYSILICON, THIN FILM TRANSISTOR USING THE POLYSILICON, AND METHOD OF FABRICATING THE THIN FILM TRANSISTOR earlier filed in the Korean Intellectual Property Office on the Jan. 10, 2007 and there duly assigned Serial No. 10-2007-0003070.

BACKGROUND OF THE INVENTION

1. Technical Field

The present invention relates to a method of forming polysilicon, a thin film transistor (TFT) using the polysilicon, and a method of fabricating the TFT.

2. Related Art

In general, display devices, such as organic light emitting diodes (OLEDs) or liquid crystal displays (LCDs), employ thin film transistors (TFTs) as switching elements.

TFTs include a gate electrode, a source electrode, and a drain electrode wherein a semiconductor channel material layer is formed between the source electrode and the drain electrode. Channel material layers may be formed of amorphous silicon or polysilicon. Since the electron mobility of polysilicon is higher than that of amorphous silicon, polysilicon has been recently preferred as a channel material for high speed operation of TFTs.

Polysilicon is generally formed by depositing amorphous silicon on a substrate using plasma enhanced chemical vapor deposition (PECVD) and crystallizing the deposited amorphous silicon. The amorphous silicon may be crystallized by thermal annealing or eximer laser crystallization (ELC). However, since thermal annealing requires a high temperature of 600° C. or more, thermal annealing is not suitable for TFTs of OLEDs or LCDs using a glass substrate. ELC can crystallize amorphous silicon at a relatively low temperature advantageously. Polysilicon crystallized at low temperature is called low temperature polysilicon (LTPS). However, ELC has a disadvantage in that, as the size of a substrate increases, crystallization uniformity decreases. Therefore, ELC is not suitable for large LCDs or OLEDs.

SUMMARY OF THE INVENTION

The present invention provides a method of forming polysilicon through local heating, a thin film transistor using the polysilicon, and a method of fabricating the thin film transistor.

According to an aspect of the present invention, a method of forming polysilicon comprises: forming an insulating layer on a substrate; forming a first electrode and a second electrode on the insulating layer; forming at least one heater layer on the insulating layer to connect the first electrode and the second electrode; forming an amorphous material layer containing silicon on the heater layer(s); forming a through-hole under the heater layer(s) by etching the insulating layer; and crystallizing the amorphous material layer into a polysilicon layer by applying a voltage between the first electrode and the second electrode so as to heat the heater layer(s).

According to another aspect of the present invention, a method of forming polysilicon comprises: forming an insulating layer on a substrate; forming at least one amorphous material layer containing silicon on the insulating layer; forming a heater layer on the amorphous material layer(s); forming on the insulating layer a first electrode and a second electrode, each connected to a respective end of the heater layer; forming a through-hole under the amorphous material layer(s) by etching the insulating layer; and crystallizing the amorphous material layer(s) into polysilicon layer(s) by applying a voltage between the first electrode and the second electrode so as to heat the heater layer.

According to another aspect of the present invention, a method of forming polysilicon comprises: forming an insulating layer on a substrate; forming, on the insulating layer, a first electrode and a second electrode; forming at least one amorphous material layer containing silicon so as to connect the first electrode and the second electrode; forming a through-hole under the amorphous material layer(s) by etching the insulating layer; and crystallizing the amorphous material layer(s) into polysilicon layer(s) by applying a voltage between the first electrode and the second electrode so as to heat the amorphous material layer.

According to another aspect of the present invention, a method of forming polysilicon comprises: forming an insulating layer on a substrate; forming, on the insulating layer, a first electrode and a second electrode; forming at least one heater layer to connect the first electrode and the second electrode; forming a through-hole under the heater layer(s) by etching the insulating layer; applying a voltage between the first electrode and the second electrode so as to heat the heater layer(s); and depositing a polysilicon layer on the heated heater layer(s).

According to another aspect of the present invention, a thin film transistor comprises: a substrate; a gate electrode formed on the substrate; an insulating layer protruding from the gate electrode; a source electrode and a drain electrode formed on a top surface of the protruding insulating layer; and at least one polysilicon layer formed in a bridge shape so as to connect the source electrode and the drain electrode.

According to another aspect of the present invention, a method of fabricating a thin film transistor comprises: sequentially forming a gate electrode and an insulating layer on a substrate; forming a source electrode and a drain electrode on the insulating layer; forming at least one heater layer on the insulating layer so as to connect the source electrode and the drain electrode; forming an amorphous material layer containing silicon on the heater layer(s); forming a through-hole under the heater layer(s) by etching the insulating layer; crystallizing the amorphous material layer into a polysilicon layer by applying a voltage between the source electrode and the drain electrode so as to heat the heater layer(s); and etching and removing an exposed portion of the heater layer(s).

According to another aspect of the present invention, a method of fabricating a thin film transistor comprises: sequentially forming a gate electrode and an insulating layer on a substrate; forming at least one amorphous material layer containing silicon on the insulating layer; forming a heater layer on the amorphous material layer(s); forming a source electrode and a drain electrode, each connected to a respective end of the heater layer on the insulating layer; forming a through-hole under the amorphous material layer(s) by etching the insulating layer; crystallizing the amorphous material layer(s) into polysilicon layer(s) by applying a voltage between the source electrode and the drain electrode so as to heat the heater layer; and etching and removing an exposed portion of the heater layer.

According to another aspect of the present invention, a method of fabricating a thin film transistor comprises: sequentially forming a gate electrode and an insulating layer on a substrate; forming, on the insulating layer, a source electrode and a drain electrode; forming at least one amorphous material layer containing silicon so as to connect the source electrode and the drain electrode; forming a through-hole under the amorphous material layer(s) by etching the insulating layer; and crystallizing the amorphous material layer(s) into polysilicon layer(s) by applying a voltage between the source electrode and the drain electrode so as to heat the amorphous material layer(s).

According to another aspect of the present invention, a method of fabricating a thin film transistor comprises: sequentially forming a gate electrode and an insulating layer on a substrate; forming, on the insulating layer, a source electrode and a drain electrode; forming at least one heater layer so as to connect the source electrode and the drain electrode; forming a through-hole under the heater layer(s) by etching the insulating layer; heating the heater layer(s) by applying a voltage between the source electrode and the drain electrode; depositing a polysilicon layer on the heated heater layer(s); and etching and removing an exposed portion of the heater layer(s).

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
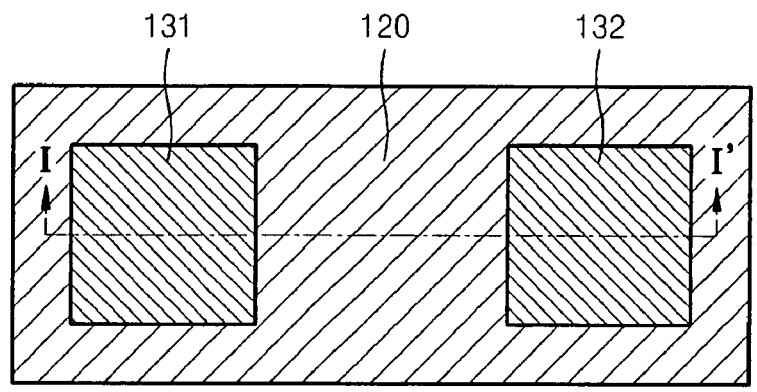
FIGS. 1A and thru 4B illustrate a method of forming polysilicon according to an embodiment of the present invention.

The present invention will now be described more fully with reference to the accompanying drawings, in which exemplary embodiments of the invention are shown. In the drawings, like reference numerals designate like elements, and the sizes of components may be exaggerated for clarity.

FIGS. 1A thru 4B illustrate a method of forming polysilicon according to an embodiment of the present invention.

Figure 1B:
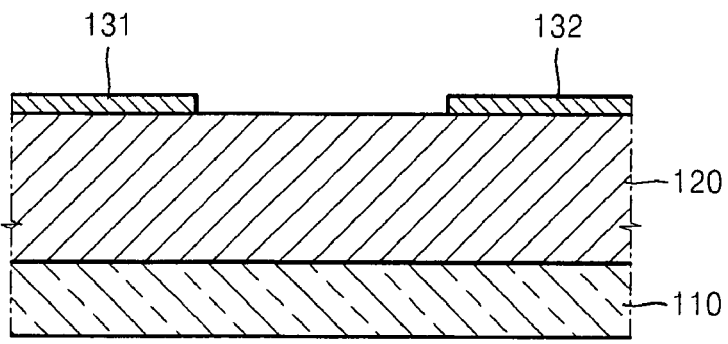

FIG. 1A is a plan view and FIG. 1B is a cross-sectional view taken along line I-I' of FIG. 1A, illustrating that an insulating layer 120 is formed on a substrate 110 and first and second electrodes 131 and 132 are formed on the insulating layer 120.

Referring to FIGS. 1A and 1B, the substrate 110 is first prepared, and then the insulating layer 120 is formed on a top surface of the substrate 110. The substrate 110 may be a glass substrate, a plastic substrate, or a silicon substrate. The insulating layer 120 may be formed of silicon oxide. The first and second electrodes 131 and 132, respectively, are formed on a top surface of the insulating layer 12 so as to be spaced apart from each other. The first and second electrodes 131 and 132, respectively, maybe formed by depositing a conductive metallic material on the top surface of the insulating layer 120, and then patterning the deposited conductive metallic material into predetermined shapes.

Figure 2A:
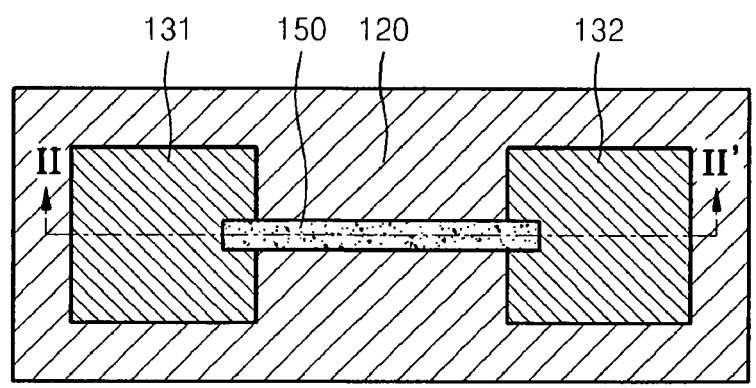
Figure 2B:
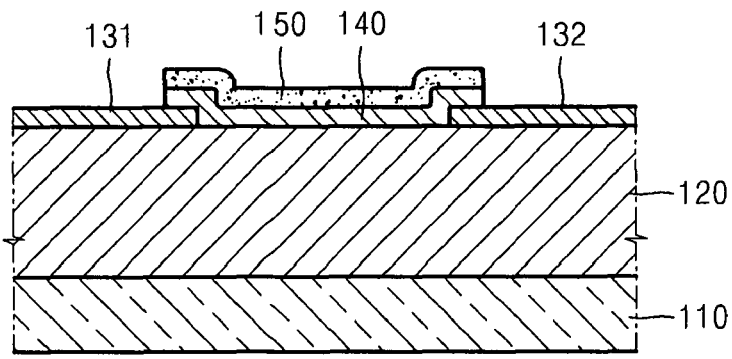

FIG. 2A is a plan view and FIG. 2B is a cross-sectional view taken along line II-II' of FIG. 2A, illustrating that a heater layer 140 is formed on the insulating layer 120, and an amorphous material layer 150 containing silicon is formed on the heater layer 140.

Referring to FIGS. 2A and 2B, the heater layer 140 is formed on the top surface of the insulating layer 120 on which the first and second electrodes 131 and 132, respectively, are placed so as to connect the first electrode 131 and the second electrode 132. The heater layer 140 may be formed of at least one selected from the group consisting of W, Mo, SiC, $ZrO_2$, $MoSi_2$, and NiCr. While one heater layer 140 is shown in FIGS. 2A and 2B, the present embodiment is not limited thereto and two or more heater layers 140 may be formed to connect the first electrode 131 and the second electrode 132. The amorphous material layer 150 containing silicon is formed on a top surface of the heater layer 140. The amorphous material layer 150 may be formed of amorphous silicon or amorphous silicon carbide. The heater layer 140 and the amorphous material layer 150 may be formed by sequentially depositing a heater material and an amorphous material containing silicon on the insulating layer 120 on which the first and second electrodes 131 and 132, respectively, are placed, and then patterning the sequentially deposited heater material and amorphous material into predetermined shapes.

Figure 3A:
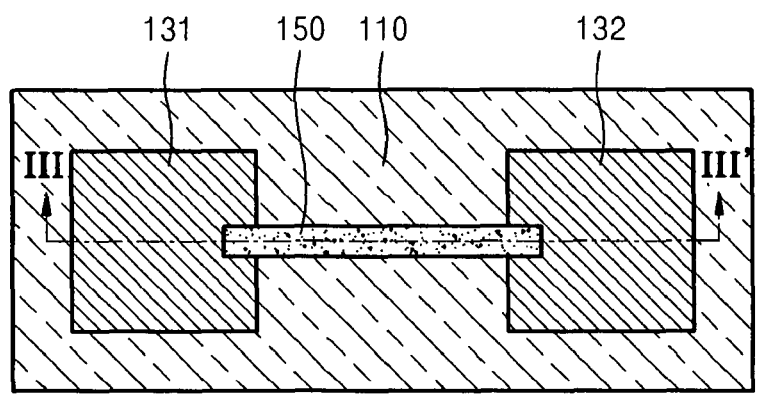
Figure 3B:
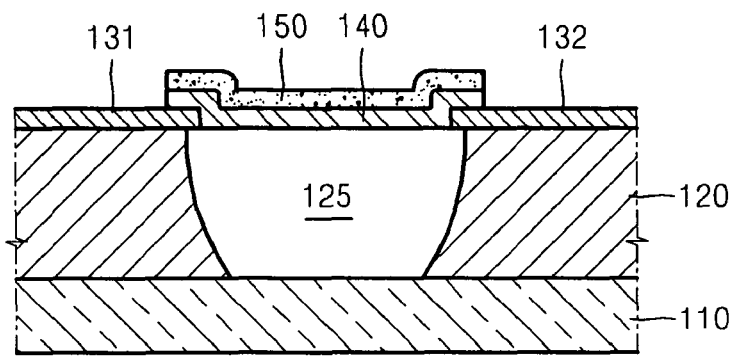

FIG. 3A is a plan view and FIG. 3B is a cross-sectional view taken along line III-III' of FIG. 3A, illustrating that the insulating layer 120 is etched until the substrate 110 is exposed.

Referring to FIGS. 3A and 3B, when the insulating layer 120 is wet etched until the substrate 110 is exposed, the insulating layer 120 is left under the first and second electrodes 131 and 132, respectively, and a through-hole 125 is formed under the heater layer 140. Accordingly, the heater layer 140 and the amorphous material layer 150 have a bridge shape connecting the first electrode 131 and the second electrode 132.

Figure 4A:
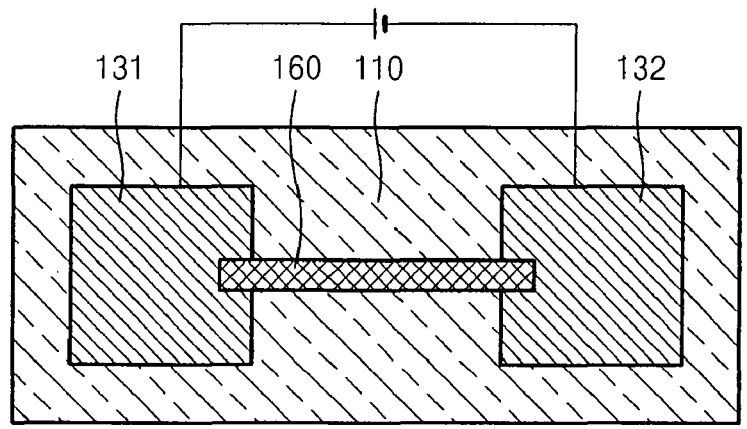
Figure 4B:
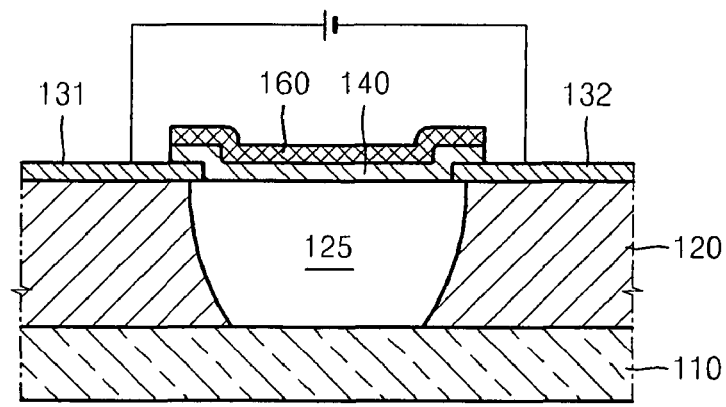

Referring to FIGS. 4A and 4B, when the heater layer 140 is heated at a predetermined temperature by applying a predetermined voltage between the first electrode 131 and the second electrode 132, the amorphous material layer 150 (FIGS. 2A, 2B, 3A and 3B) formed on the heater layer 140 is crystallized into a polysilicon layer 160. The heater layer 140 may be heated at a temperature of approximately 600° C. or more. In this case, since only the amorphous material layer 150 formed on the heater layer 140 is heated, the substrate 110 can be maintained at a temperature of 200° C. or less. While a direct current (DC) voltage is applied between the first and second electrodes 131 and 132, respectively, in FIGS. 4A and 4B, the present embodiment is not limited thereto, and an alternating current (AC) voltage or a pulse voltage maybe applied between the first and second electrodes 131 and 132, respectively.

FIGS. 5A thru 8B illustrate a method of forming polysilicon according to another embodiment of the present invention.

Figure 5A:
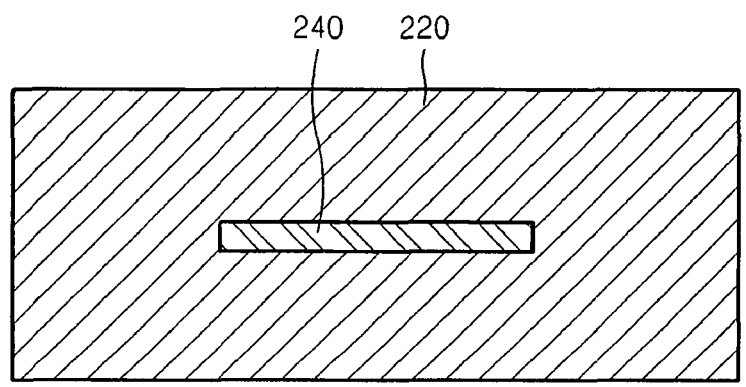
FIGS. 5A thru 8B illustrate a method of forming polysilicon according to another embodiment of the present invention.
Figure 5B:
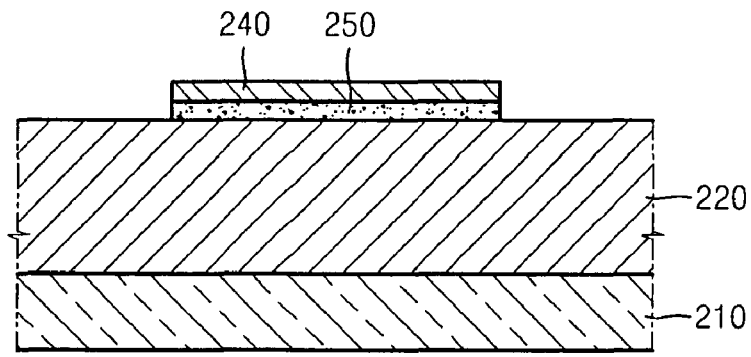

FIGS. 5A and 5B are a plan view and a cross-sectional view, respectively, illustrating that an insulating layer 220 is formed on a substrate 210, and an amorphous material layer 250 and a heater layer 240 are sequentially formed on the insulating layer 220.

Referring to FIGS. 5A and 5B, the substrate 210 is first prepared, and then the insulating layer 220 is formed on a top surface of the substrate 210. The substrate 210 may be a glass substrate, a plastic substrate, or a silicon substrate. The insulating layer 220 may be formed of silicon oxide. Next, the amorphous material layer 250 containing silicon is formed on a top surface of the insulating layer 220. The amorphous material layer 250 may be formed of amorphous silicon or amorphous silicon carbide. While one amorphous silicon layer 250 is shown as being formed on the top surface of the insulating layer 220, the present embodiment is not limited thereto, and two or more amorphous silicon layers 250 may be formed. The heater layer 240 is formed on a top surface of the amorphous material layer 250. The heater layer 240 may be formed of at least one selected from the group consisting of W, Mo, SiC, $ZrO_2$, $MoSi_2$, and NiCr. The amorphous material layer 250 and the heater layer 240 may be formed by sequentially depositing an amorphous material containing silicon and a heater material on the insulating layer 220, and then patterning the deposited amorphous material and the heater material into predetermined shapes.

Figure 6A:
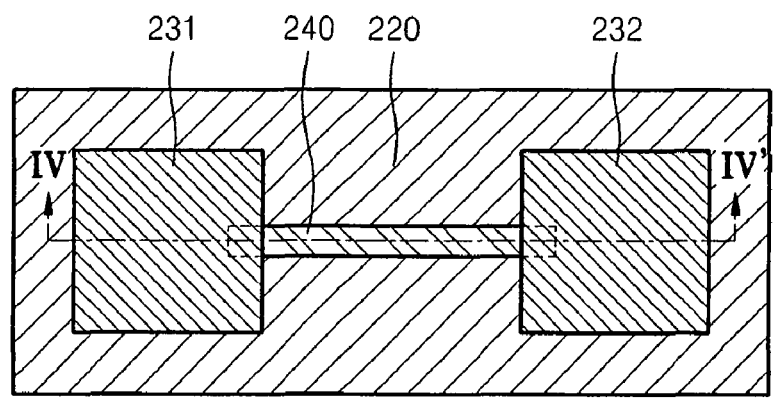
Figure 6B:
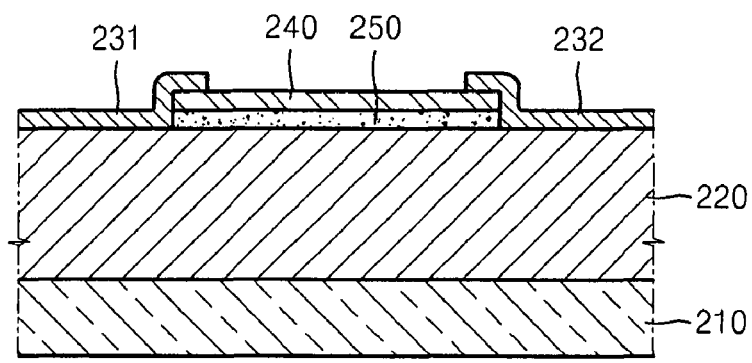

FIG. 6A is a plan view illustrating that first and second electrodes 231 and 232, respectively, are formed to be connected to both ends of the heater layer 240, and FIG. 6B is a cross-sectional view taken along line IV-IV' of FIG. 6A.

Referring to FIGS. 6A and 6B, the first and second electrodes 231 and 232, respectively, may be formed by depositing a conductive metallic material on the insulating layer 220 on which the amorphous material layer 250 and the heater layer 240 are placed, and then patterning the deposited conductive metallic material into predetermined shapes. Accordingly, the first and second electrodes 231 and 232, respectively, are connected to top surfaces of respective ends of the heater layer 240.

Figure 7A:
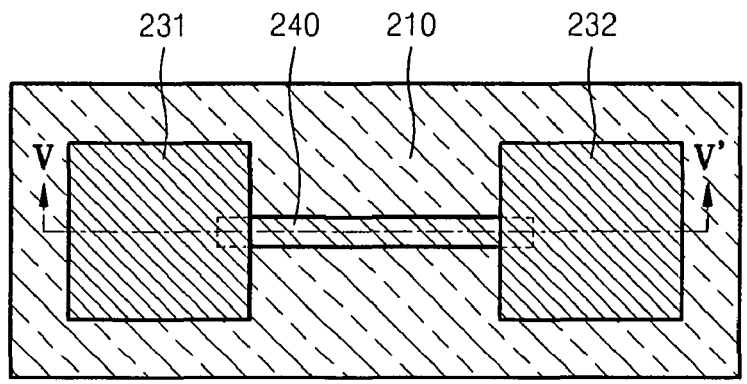
Figure 7B:
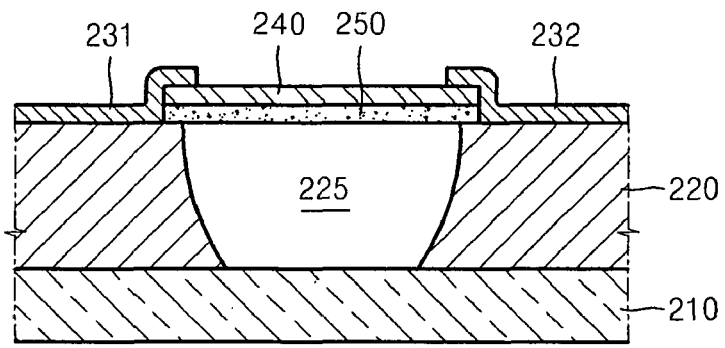

FIG. 7A is a plan view and FIG. 7B is a cross-sectional view taken along line V-V' of FIG. 7A, illustrating that the insulating layer 220 is etched until the substrate 210 is exposed.

Referring to FIGS. 7A and 7B, when the insulating layer 220 is wet etched until the substrate 210 is exposed, the insulating layer 220 is left under the first and second electrodes 231 and 232, respectively, and a through-hole 225 is formed under the amorphous material layer 250. Accordingly, the amorphous material layer 250 and the heater layer 240 have a bridge shape connecting the first electrode 231 and the second electrode 232.

Figure 8A:
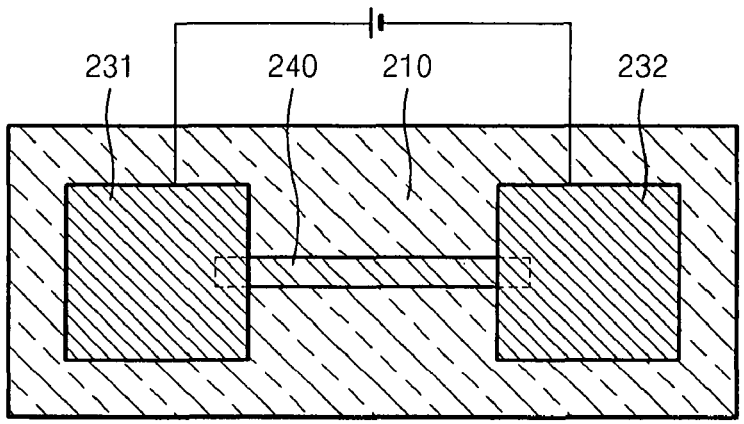
Figure 8B:
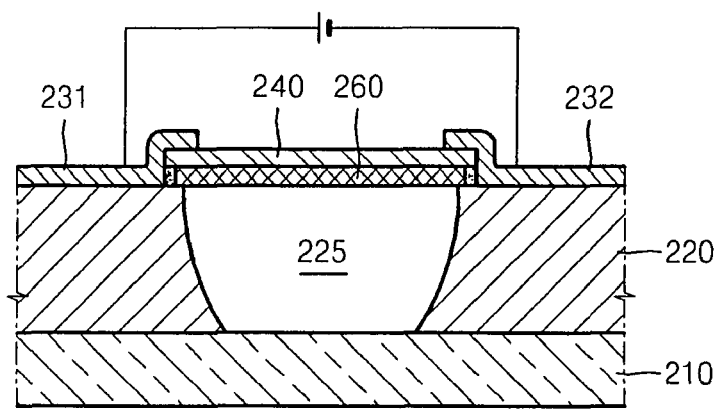

Referring to FIGS. 8A and 8B, when the heater layer 240 is heated at a predetermined temperature by applying a predetermined voltage between the first electrode 231 and the second electrode 232, the amorphous material layer 250 formed on a bottom surface of the heater layer 240 is crystallized into a polysilicon layer 260. The heater layer 240 may be heated at a temperature of approximately 600° C. or more. In this case, since only the amorphous material layer 250 formed on the heater layer 240 is heated, the substrate 210 can be maintained at a temperature of 200° C. or less. While a DC voltage is shown as being applied between the first and second electrodes 231 and 232, respectively, in FIGS. 8A and 8B, the present embodiment is not limited thereto, and an AC voltage or a pulse voltage may be applied between the first and second electrodes 231 and 232, respectively.

FIGS. 9A thru 10B illustrate a method of forming polysilicon according to another embodiment of the present invention.

Figure 9A:
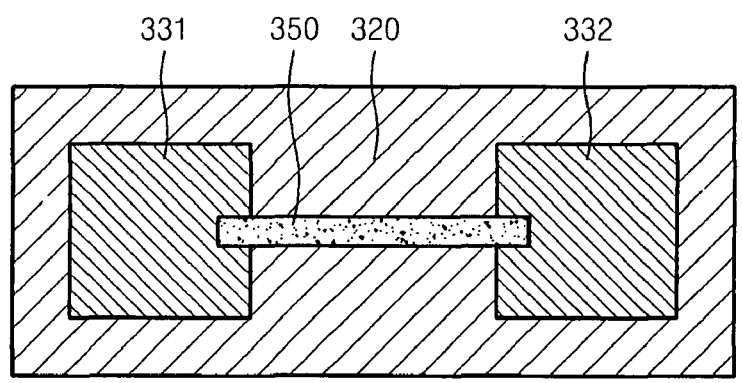
FIGS. 9A thru 10B illustrate a method of forming polysilicon according to another embodiment of the present invention.
Figure 9B:
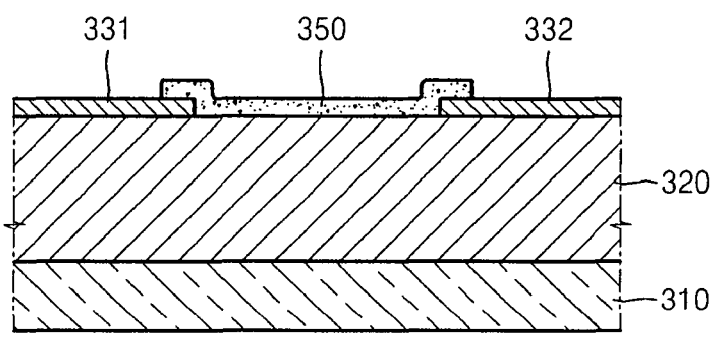

Referring to FIGS. 9A and 9B, a substrate 310 is first prepared, and then an insulating layer 320 is formed on a top surface of the substrate 310. The substrate 310 may be a glass substrate, a plastic substrate, or a silicon substrate. The insulating layer 320 may be formed of silicon oxide. First and second electrodes 331 and 332, respectively, are formed on a top surface of the insulating layer 320 so as to be spaced apart from each other. Next, an amorphous material layer 350 containing silicon is formed on the top surface of the insulating layer 320 so as to connect the first electrode 331 and the second electrode 332. The amorphous material layer 350 maybe formed of amorphous silicon or amorphous silicon carbide. The amorphous material layer 350 may be formed by depositing an amorphous material containing silicon on the top surface of the insulating layer 320 on which the first and second electrodes 331 and 332, respectively, are placed, and then patterning the deposited amorphous material into a predetermined shape. While one amorphous material layer 350 is shown as being formed in FIGS. 9A and 9B, the present embodiment is not limited thereto, and a plurality of amorphous material layers 350 may be formed to connect the first electrode 331 and the second electrode 332.

Figure 10A:
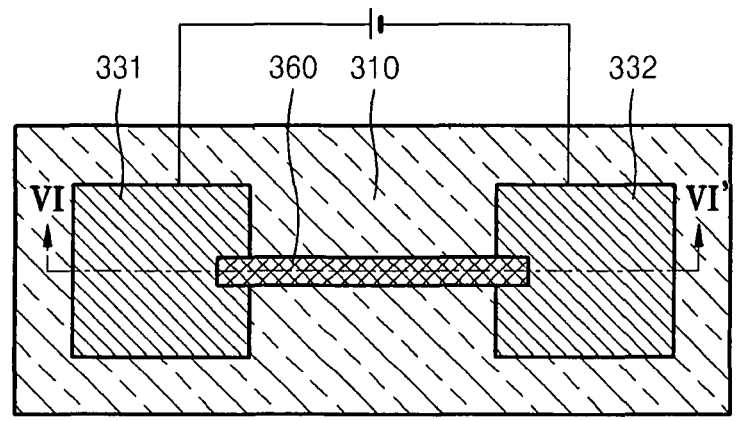
Figure 10B:
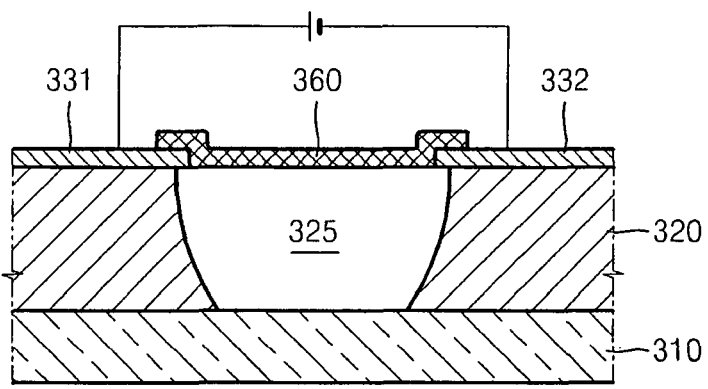

Referring to FIG. 10B, which is a cross-sectional view taken along line VI-VI' of FIG. 10A, when the insulating layer 320 is wet etched until the substrate 310 is exposed, the insulating layer 320 is left under the first and second electrodes 331 and 332, respectively, and a through-hole 325 is formed under the amorphous material layer 350. Accordingly, the amorphous material layer 350 has a bridge shape connecting the first electrode 331 and the second electrode 332. Next, when a predetermined voltage is applied between the first electrode 331 and the second electrode 332, the amorphous material layer 350 is heated at a predetermined temperature, and thus the amorphous material layer 350 is crystallized into a polysilicon layer 360. The amorphous material layer 350 may be heated at a temperature of approximately 600° C. or more. In this case, since only the amorphous material layer 350 is heated, the substrate 310 can be maintained at a temperature of 200° C. or less. While a DC voltage is shown as being applied between the first and second electrodes 331 and 332, respectively, in FIGS. 10A and 10B, the present embodiment is not limited thereto, and an AC voltage or a pulse voltage may be applied between the first and second electrodes 331 and 332, respectively.

While the first and second electrodes 331 and 332, respectively, are first formed on the top surface of the insulating layer 320, and then the amorphous material layer 350 connecting the first and second electrodes 331 and 332, respectively, are formed in FIGS. 9A thru 10B, the amorphous material layer 350 may be first formed on the top surface of the insulating layer 320, and then the first and second electrodes 331 and 332, respectively, connected to respective ends of the amorphous material layer 350 may be formed.

FIGS. 11A thru 13B illustrate a method of forming polysilicon according to another embodiment of the present invention.

Figure 11A:
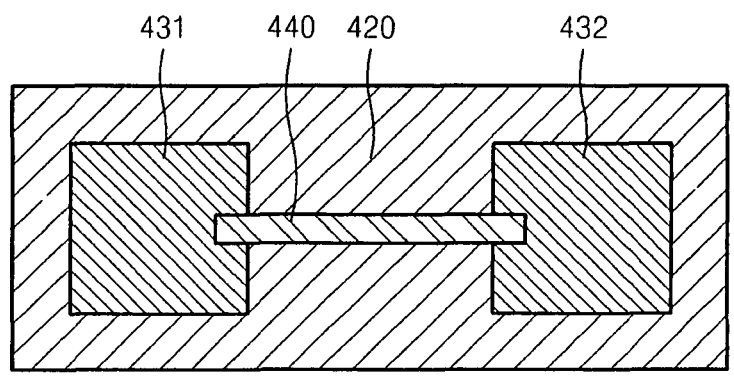
FIGS. 11A thru 13B illustrate a method of forming polysilicon according to another embodiment of the present invention.
Figure 11B:
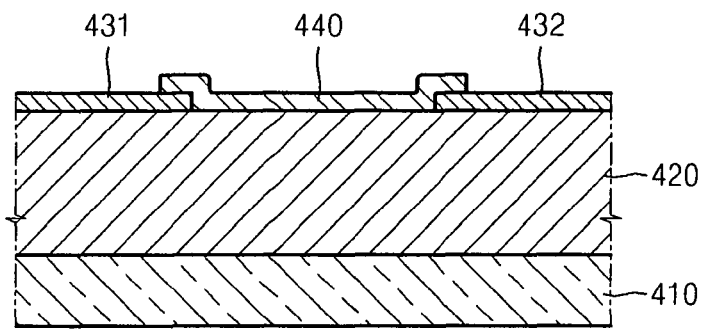

Referring to FIGS. 11A and 11B, a substrate 410 is first prepared, and then an insulating layer 420 is formed on a top surface of the substrate 410. The substrate 410 may be a glass substrate, a plastic substrate, or a silicon substrate. The insulating layer 420 may be formed of silicon oxide. First and second electrodes 431 and 432, respectively, are formed on a top surface of the insulating layer 420. Next, a heater layer 440 is formed on the top surface of the insulating layer 420 so as to connect the first electrode 431 and the second electrode 432. The heater layer 440 may be formed of at least one selected from the group consisting of W, Mo, SiC, $ZrO_2$, $MoSi_2$, and NiCr. The heater layer 440 may be formed by depositing a heater material on the top surface of the insulating layer 420 on which the first and second electrodes 431 and 432, respectively, are placed, and then patterning the deposited heater material into a predetermined shape. While one heater layer 440 is shown in FIGS. 11A and 11B, two or more heater layers 440 may be formed to connect the first electrode 431 and the second electrode 432.

Figure 12A:
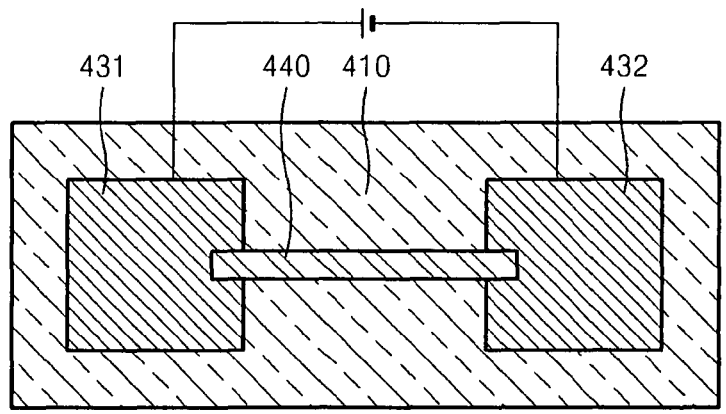
Figure 12B:
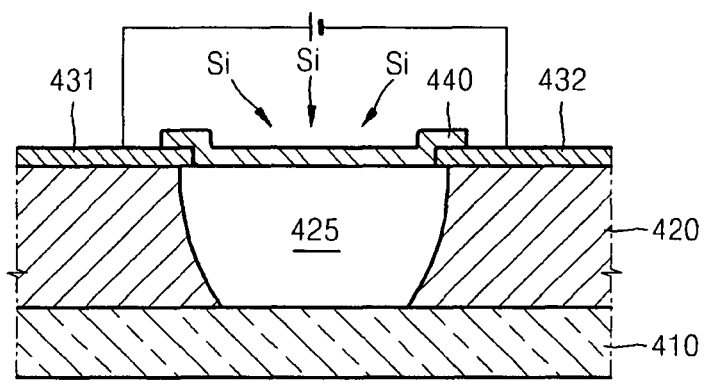
Figure 13A:
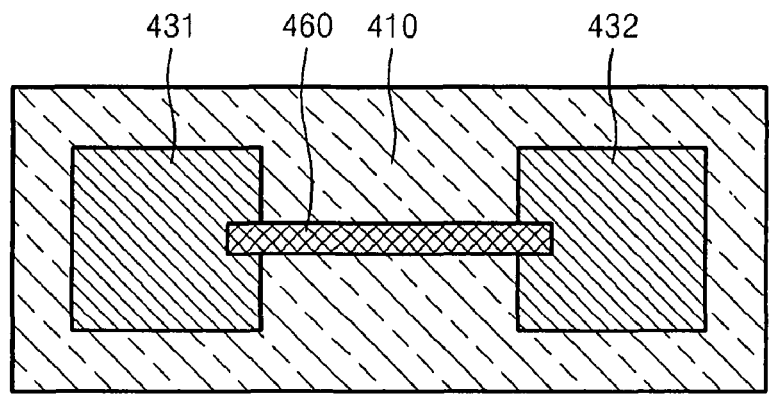
Figure 13B:
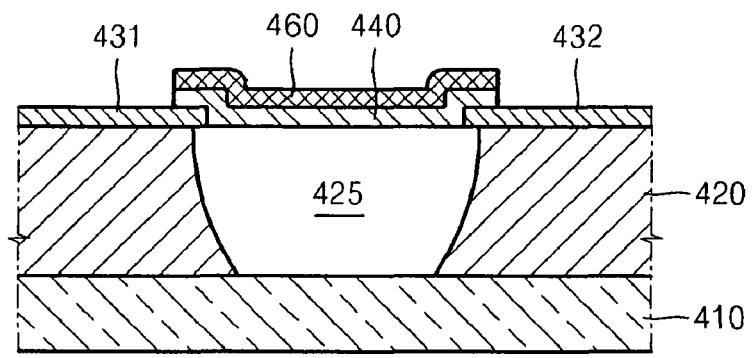

Referring to FIGS. 12A and 12B, when the insulating layer 420 is wet etched until the substrate 410 is exposed, the insulating layer 420 is left under the first and second electrodes 431 and 432, respectively, and a through-hole 425 is formed under the heater layer 440. Accordingly, the heater layer 440 has a bridge shape connecting the first electrode 431 and the second electrode 432. Next, the heater layer 440 is heated at a predetermined temperature by applying a predetermined voltage between the first electrode 431 and the second electrode 432. The heater layer 440 may be heated at a temperature of approximately 600° C. or more. While a DC voltage is shown as being applied between the first and second electrodes 431 and 432, respectively, in FIGS. 12A and 12B, the present embodiment is not limited thereto, and an AC voltage or a pulse voltage may be applied between the first and second electrodes 431 and 432, respectively. In the state where the heater layer 440 is heated, when silicon is deposited on the heater layer 440 by chemical vapor deposition (CVD), e.g., low pressure chemical vapor deposition (LPCVD), using a silane gas as a source gas, a polysilicon layer 460 is formed on the heater layer 440 as shown in FIGS. 13A and 13B.

While the first and second electrodes 431 and 432, respectively, are first formed on the top surface of the insulating layer 420, and then the heater layer 440 is formed to connect the first and second electrodes 431 and 432, respectively, in FIGS. 11A thru 13B, the heater layer 440 may be first formed on the top surface of the insulating layer 420, and then the first and second electrodes 431 and 432, respectively, connected to respective ends of the heater layer 440 may be formed.

As described above, since only the amorphous silicon layer and/or the heater layer connecting the first electrode and the second electrode is selectively heated to form the polysilicon layer, even though the substrate is a glass substrate which is sensitive to heat, the risk that the glass substrate may be deformed by high temperature can be avoided.

A thin film transistor (TFT) using the polysilicon formed by the polysilicon forming method will now be explained.

Figure 14A:
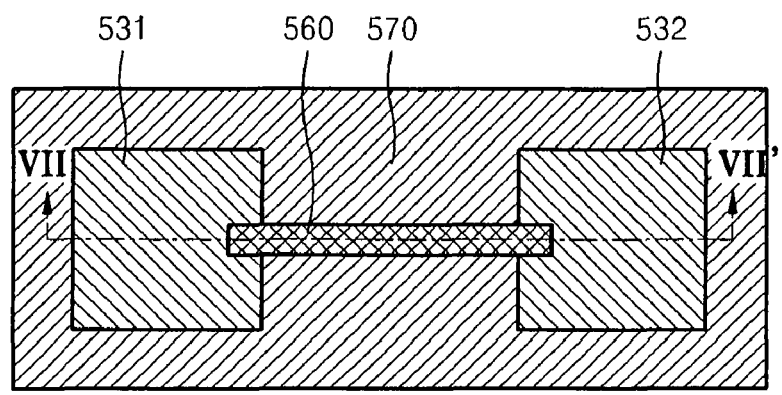
FIGS. 14A and 14B are a plan view and a cross-sectional view, respectively, of a thin film transistor (TFT) according to an embodiment of the present invention.
Figure 14B:
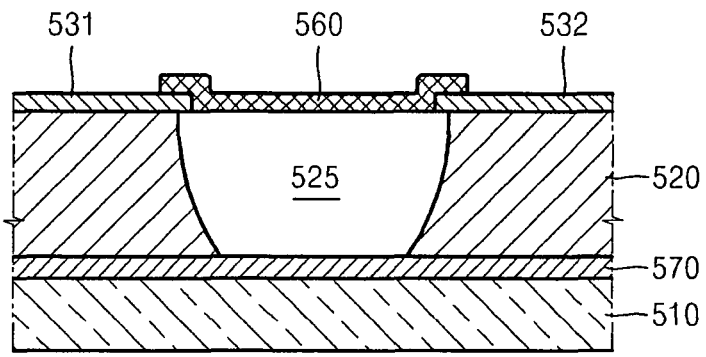

FIGS. 14A is a plan view of a TFT according to an embodiment of the present invention, and FIG. 14B is a cross-sectional view taken along line VII-VII' of FIG. 14A.

Referring to FIGS. 14A and 14B, a gate electrode 570 is formed on a top surface of a substrate 510. The substrate 510 may be a glass substrate, a plastic substrate, or a silicon substrate. The gate electrode 570 may be formed of at least one selected from the group consisting of Ni, Al, Nd, Pt, Au, Co, Ir, Cr, and Mo. An insulating layer 520 protrudes from a top surface of the gate electrode 570. The insulating layer 520 may be formed of silicon oxide. A source electrode 531 and a drain electrode 532 are formed on a top surface of the protruding insulating layer 520. The source electrode 531 and the drain electrode 532 may be formed of Cr/Al, amorphous silicon/Al, or Cr/Mo. A polysilicon layer 560 is formed between the source electrode 531 and the drain electrode 532 so as to connect the source electrode 531 and the drain electrode 532. In detail, bottom surfaces of respective ends of the polysilicon layer 560 are connected to top surfaces of the source electrode 531 and the drain electrode 532, respectively. Accordingly, the polysilicon layer 560 has a bridge shape connecting the source electrode 531 and the drain electrode 532, and a through-hole 525 is formed under the polysilicon layer 560. Air present in the through-hole 525 forms a gate insulating layer of the TFT. While one polysilicon layer 560 is shown as being formed to connect the source electrode 531 and the drain electrode 532 in FIGS. 14A and 14B, the present embodiment is not limited thereto, and a plurality of polysilicon layers 560 may be formed to connect the source electrode 531 and the drain electrode 532.

Figure 15:
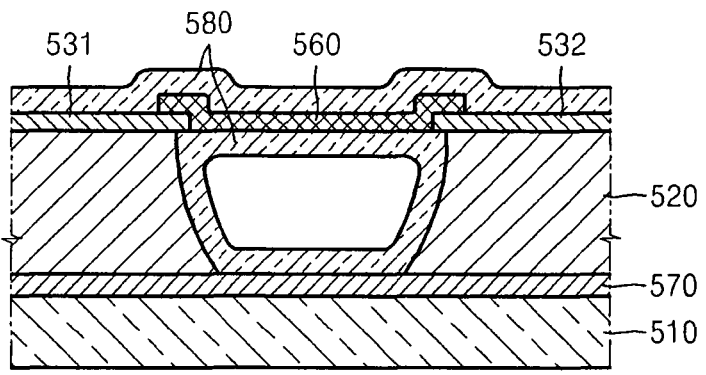
FIG. 15 is a cross-sectional view of a modification of the TFT of FIGS. 14A and 14B.

FIG. 15 is a cross-sectional view of a modification of the TFT of FIGS. 14A and 14B.

Referring to FIG. 15, an oxide layer 580 is formed on an entire surface of the TFT of FIGS. 14A and 14B. The oxide layer 580 maybe formed of silicon oxide. Accordingly, the oxide layer 580 is also formed on an inner wall of the through-hole 525 (see FIG. 14B) under the polysilicon layer 560, so that the oxide layer 580 and the air present in the through-hole 525 surrounded by the oxide layer 580 form a gate insulating layer. Alternatively, the oxide layer 580 maybe formed to fill the through-hole 525 underthepolysilicon layer 580. In this case, the oxide layer 580 filling the through-hole 525 forms a gate insulating layer.

Figure 16A:
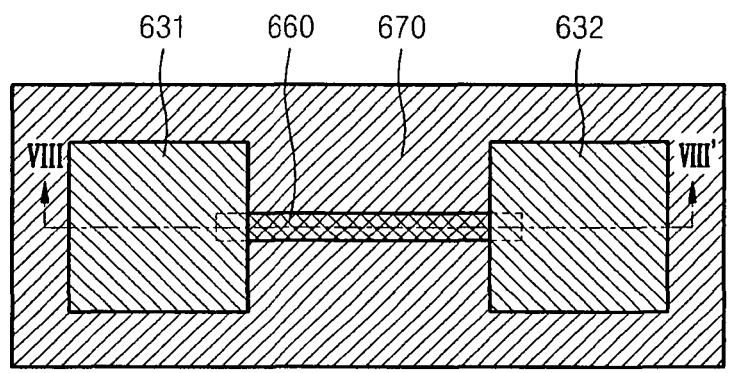
FIGS. 16A and 16B are a plan view and a cross-sectional view, respectively, of a TFT according to another embodiment of the present invention.
Figure 16B:
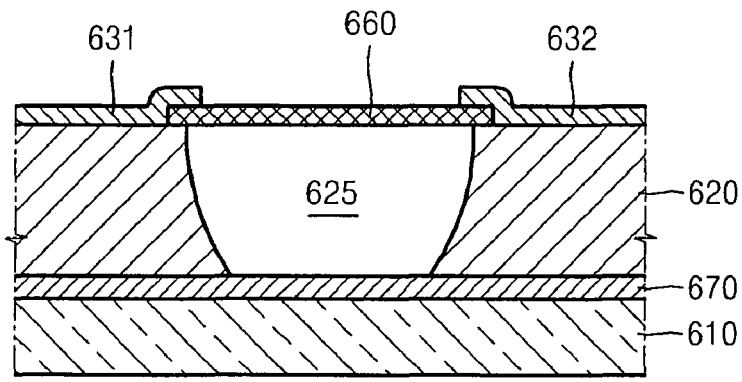

FIG. 16A is a plan view of a TFT according to another embodiment of the present invention, and FIG. 16B is a cross-sectional view taken along line VIII-VIII' of FIG. 16A.

The following explanation will focus on a difference between the TFT in FIGS. 14A and 14B and the TFT in FIGS. 16A and 16B.

Referring to FIGS. 16A and 16B, a gate electrode 670 is formed on a substrate 610, and an insulating layer 620 protrudes from a top surface of the gate electrode 670. A source electrode 631 and a drain electrode 632 are formed on a top surface of the protruding insulating layer 620. A polysilicon layer 660 is formed between the source electrode 631 and the drain electrode 632 so as to connect the source electrode 631 and the drain electrode 632. Top surfaces of respective ends of the polysilicon layer 660 are connected to bottom surfaces of the source electrode 631 and the drain electrode 632, respectively, unlike the polysilicon layer 560 of FIGS. 14A and 14B. Accordingly, the polysilicon layer 660 has a bridge shape connecting the source electrode 631 and the drain electrode 632, and a through-hole 625 is formed under the polysilicon layer 660. Air present in the through-hole 625 forms a gate insulating layer of the TFT. While one polysilicon layer 660 is formed so as to connect the source electrode 631 and the drain electrode 632 in FIGS. 16A and 16B, the present embodiment is not limited thereto, and a plurality of polysilicon layers 660 may be formed so as to connect the source electrode 631 and the drain electrode 632.

Figure 17:
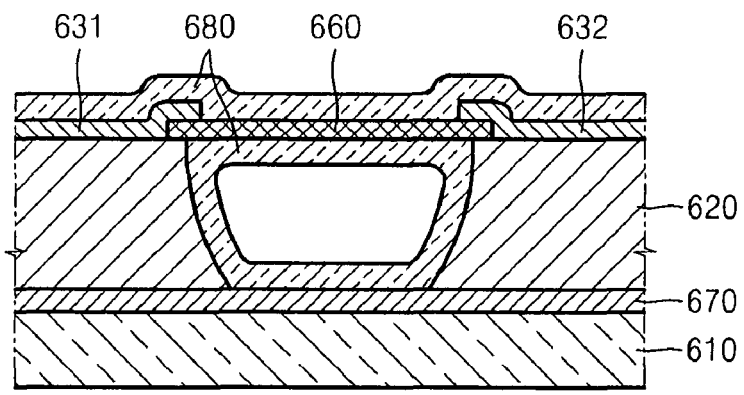
FIG. 17 is a cross-sectional view of a modification of the TFT of FIGS. 16A and 16B.

FIG. 17 is a cross-sectional view of a modification of the TFT of FIGS. 16A and 16B.

Referring to FIG. 17, an oxide layer 680 is formed on an entire surface of the TFT of FIGS. 16A and 16B. Accordingly, the oxide layer 680 is also formed on an inner wall of the through-hole 625 (see FIG. 16B) under the polysilicon layer 660 so that the oxide layer 680 and the air present in the through-hole 625 surrounded by the oxide layer 680 form a gate insulating layer. Alternatively, the oxide layer 680 may be formed so as to fill the through-hole 625 under the polysilicon layer 660. In this case, the oxide layer 680 filling the through-hole 625 forms a gate insulating layer.

A method of fabricating the TFT will now be explained.

FIGS. 18A thru 22 illustrate a method of fabricating a TFT according to an embodiment of the present invention.

Figure 18A:
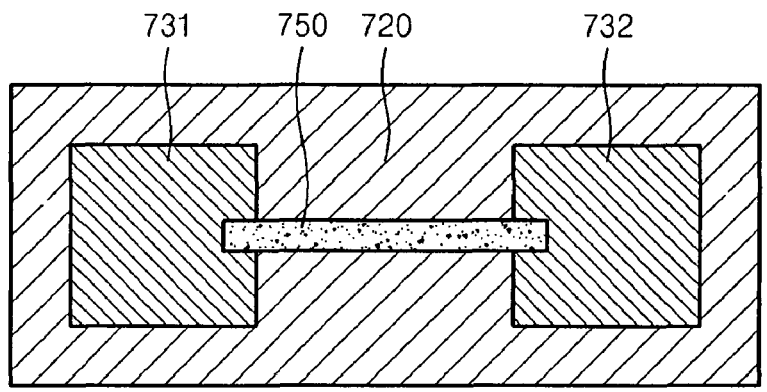
FIGS. 18A thru 22 illustrate a method of fabricating a TFT according to an embodiment of the present invention.
Figure 18B:
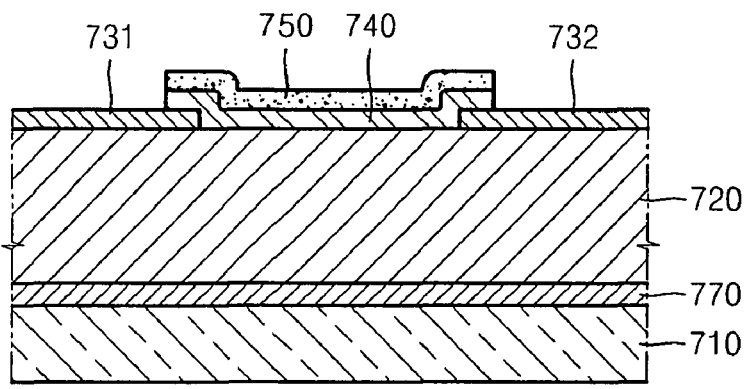

Referring to FIGS. 18A and 18B, a substrate 710 is first prepared. The substrate 710 may be a glass substrate, a plastic substrate, or a silicon substrate. A gate electrode 770 is formed on a top surface of the substrate 710. The gate electrode 770 may be formed of at least one selected from the group consisting of Ni, Al, Nd, Pt, Au, Co, Ir, Cr, and Mo. The gate electrode 770 may be formed by depositing the selected material on the top surface of the substrate 710, and then patterning the deposited selected material into a predetermined shape. Next, an insulating layer 720 is formed on a top surface of the gate electrode 770. The insulating layer 720 may be formed of silicon oxide. A source electrode 731 and a drain electrode 732 are then formed on a top surface of the insulating layer 720. The source electrode 731 and the drain electrode 732 may be formed of one selected from the group consisting of Cr/Al, amorphous silicon/Al, and Cr/Mo. The source electrode 732 and the drain electrode 732 may be formed by depositing the selected material on the top surface of the insulating layer 720, and then patterning the deposited material into predetermined shapes.

Next, a heater layer 740 is formed on the top surface of the insulating layer 720 on which the source electrode 731 and the drain electrode 732 are placed so as to connect the source electrode 731 and the drain electrode 732. The heater layer 740 maybe formed of a material such that only the heater layer 740 can be selectively etched by a predetermined etching solution in a subsequent etching process. For example, the heater layer 740 may be formed of at least one selected from the group consisting of W, Mo, SiC, $ZrO_2$, $MoSi_2$, and NiCr. While one heater layer 740 is shown in FIGS. 18A and 18B, the present embodiment is not limited thereto, and two or more heater layers 740 maybe formed to connect the source electrode 731 and the drain electrode 732. An amorphous material layer 750 containing silicon is formed on a top surface of the heater layer 740. The amorphous material layer 750 may be formed of amorphous silicon or amorphous silicon carbide. The heater layer 740 and the amorphous material layer 750 may be formed by sequentially depositing a heater material and an amorphous material containing silicon on the insulating layer 720 on which the source electrode 731 and the drain electrode 732 are placed, and then patterning the deposited heater material and the amorphous material into predetermined shapes.

Figure 19A:
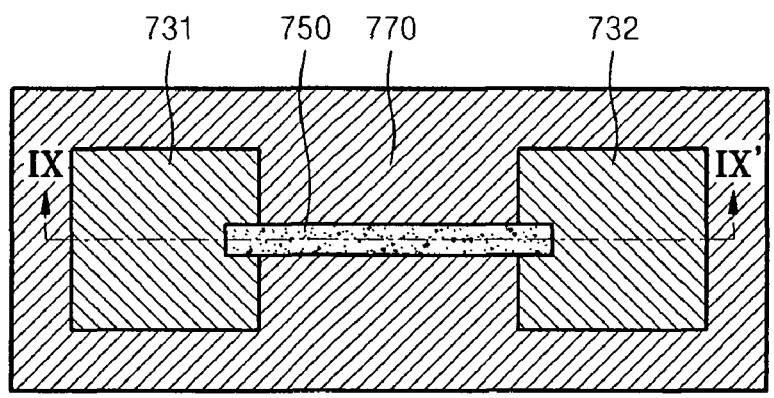
Figure 19B:
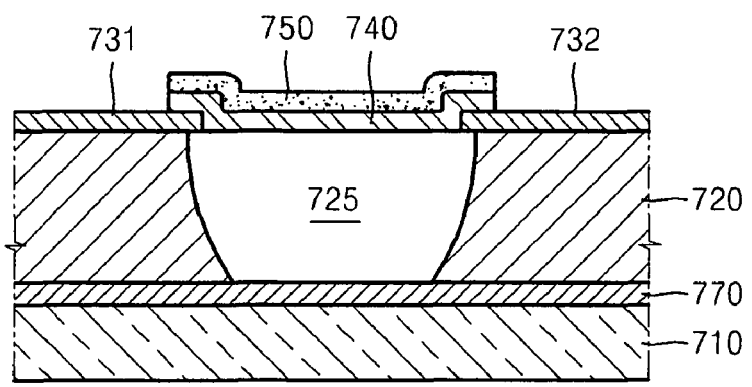

FIG. 19A is a plan view and FIG. 19B is a cross-sectional view taken along line IX-IX' of FIG. 19A, illustrating that the insulating layer 720 is etched until the gate electrode 770 is exposed.

Referring to FIGS. 19A and 19B, when the insulating layer 720 is wet etched until the gate electrode 770 is exposed, the insulating layer 720 is left under the source electrode 731 and the drain electrode 732, and a through-hole 725 is formed under the heater layer 740. Accordingly, the heater layer 740 and the amorphous material layer 750 have a bridge shape connecting the source electrode 731 and the drain electrode 732.

Figure 20A:
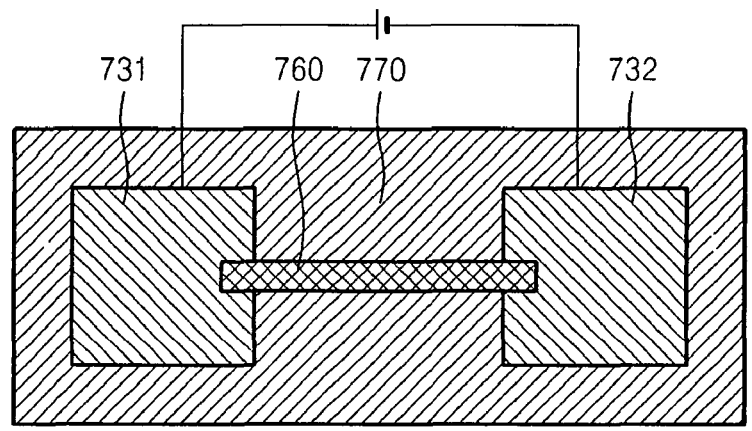
Figure 20B:
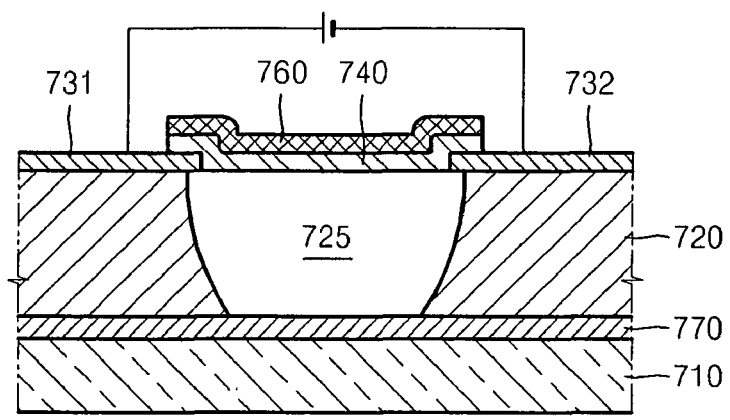

Referring to FIGS. 20A and 20B, when the heater layer 740 is heated at a predetermined temperature by applying a predetermined voltage between the source electrode 731 and the drain electrode 732, the amorphous material layer 750 formed on the heater layer 740 is crystallized into a polysilicon layer 760. The heater layer 740 may be heated at a temperature of approximately 600° C. or more. In this case, since only the amorphous material layer 750 formed on the heater layer 740 is heated, the substrate 710 can be maintained at a temperature of 200° C. or less. While a DC current is shown as being applied between the source electrode 731 and the drain electrode 732 in FIGS. 20A and 20B, the present embodiment is not limited thereto, and an AC voltage or a pulse voltage may be applied between the source electrode 731 and the drain electrode 732.

Figure 21A:
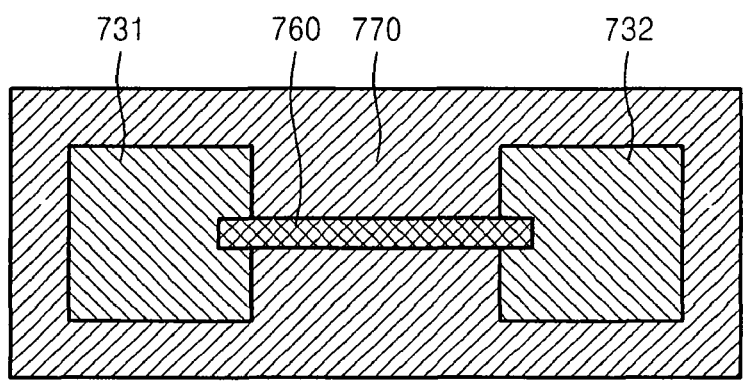
Figure 21B:
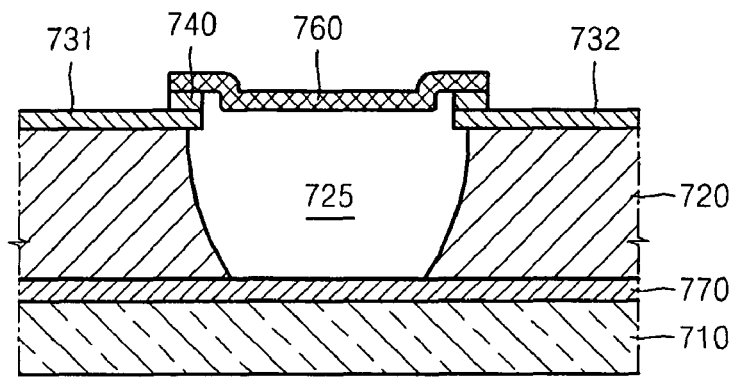

Referring to FIGS. 21A and 21B, an exposed portion of the heater layer 740 is etched and removed. In the etching of the heater layer 740, since the heater layer 740 is formed of a material having etch selectivity, only the heater layer 740 can be selectively etched by the predetermined etching solution. A TFT is completed through the above processes. Air present in the through-hole 725 forms a gate insulating layer.

Figure 22:
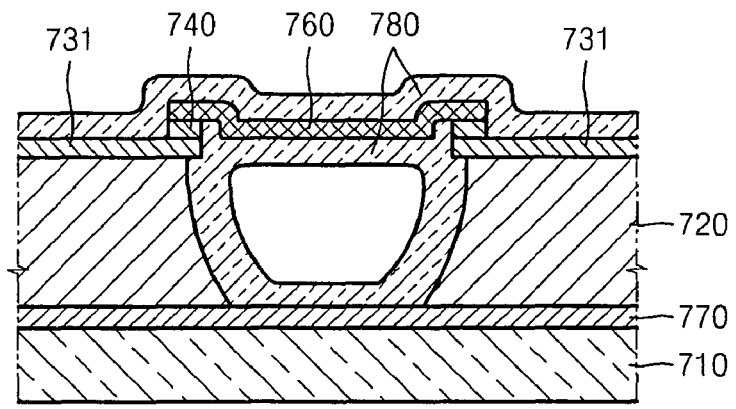

A process shown in FIG. 22 may be added to the present embodiment. That is, referring to FIG. 22, an oxide layer 780 is formed on an entire surface of the structure of FIGS. 21A and 21B. Accordingly, the oxide layer 780 is also formed on an inner wall of the through-hole 725 under the polysilicon layer 760 so that the oxide layer 780 and the air present in the through-hole 725 surrounded by the oxide layer 780 form a gate insulating layer. Alternatively, the oxide layer 780 maybe formed so as to fill the through-hole 725 under the polysilicon layer 760. In this case, the oxide layer 780 filling the through-hole 725 forms a gate insulating layer.

FIGS. 23A thru 28 illustrate a method of fabricating a TFT according to another embodiment of the present invention.

Figure 23A:
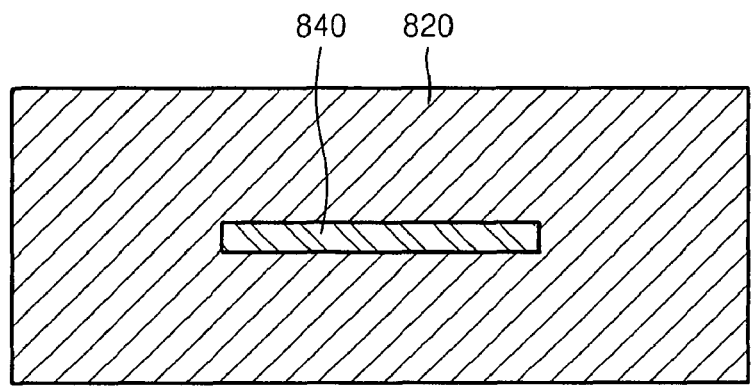
FIGS. 23A thru 28 illustrate a method of fabricating a TFT according to another embodiment of the present invention.
Figure 23B:
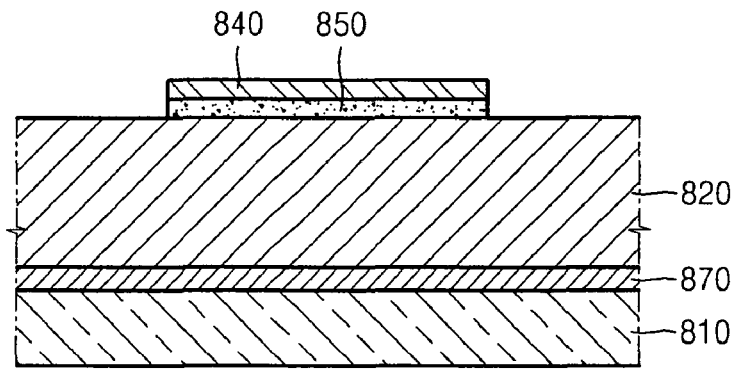

Referring to FIGS. 23A and 23B, a substrate 810 is first prepared, and then a gate electrode 870 is formed on a top surface of the substrate 810. An insulating layer 820 is formed on a top surface of the gate electrode 870. Since the substrate 810, the gate electrode 870, and the insulating layer 820 are the same as those already described above, a detailed explanation thereof will not be given. Next, an amorphous material layer 850 containing silicon is formed on a top surface of the insulating layer 820. The amorphous material layer 850 may be formed of amorphous silicon or amorphous silicon carbide. While one amorphous silicon layer 850 is shown as being formed on the top surface of the insulating layer 820 in FIGS. 23A and 23B, the present embodiment is not limited thereto, and two or more amorphous silicon layers 850 may be formed. A heater layer 840 is formed on a top surface of the amorphous material layer 850. The heater layer 840 may be formed of a material such that only the heater layer 840 can be selectively etched by a predetermined etching solution in a subsequent etching process. For example, the heater layer 840 may be formed of at least one selected from the group consisting of W, Mo, SiC, $ZrO_2$, $MoSi_2$, and NiCr. The amorphous material layer 850 and the heater layer 840 may be formed by sequentially depositing an amorphous material containing silicon and a heater material on the insulating layer 820, and then patterning the deposited amorphous material and heater material into predetermined shapes.

Figure 24A:
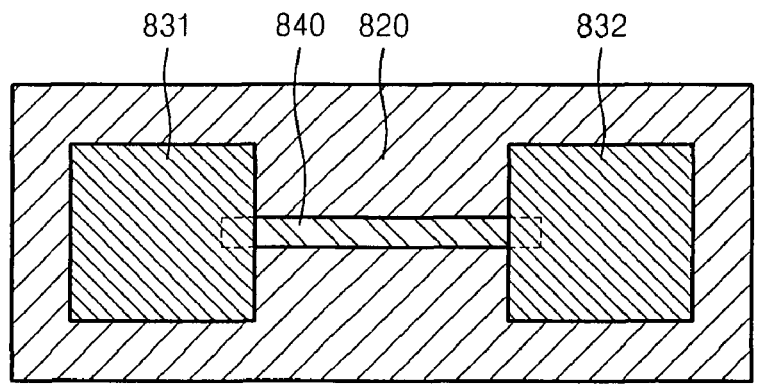
Figure 24B:
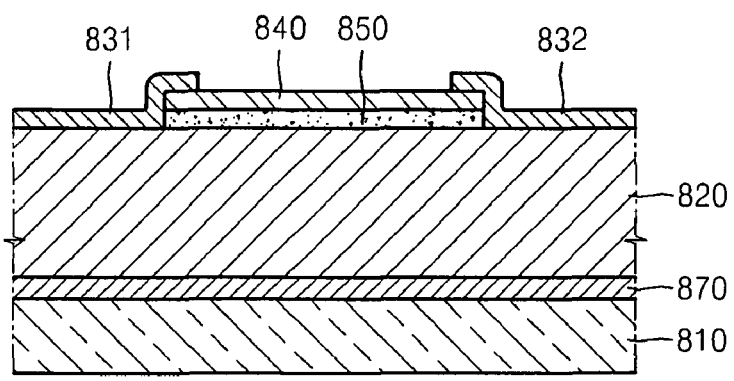

Referring to FIGS. 24A and 24B, a source electrode 831 and a drain electrode 832 are formed on the insulating layer 820 so as that each is connected to a respective end of the heater layer 840. The source electrode 831 and the drain electrode 832 may be formed by depositing a conductive metallic material on the insulating layer 820 on which the amorphous material layer 850 and the heater layer 840 are placed, and then patterning the deposited conductive metallic material into predetermined shapes. Accordingly, the source electrode 831 and the drain electrode 832 are connected to top surfaces of respective ends of the heater layer 840.

Figure 25A:
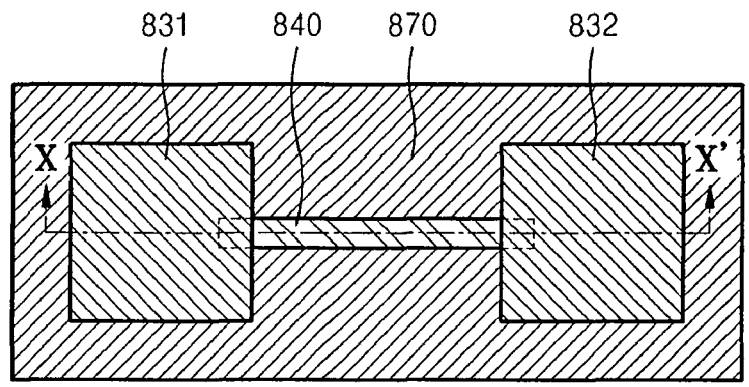
Figure 25B:
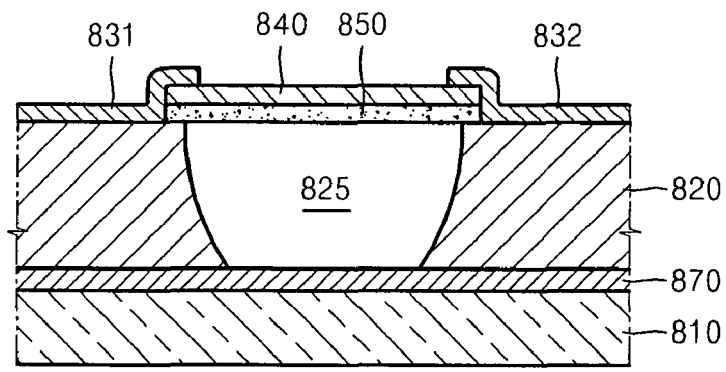

FIG. 25A is a plan view and FIG. 25B is a cross-sectional view taken along line X-X' of FIG. 25A, illustrating that the insulating layer 820 is etched until the gate electrode 870 is etched.

Referring to FIGS. 25A and 25B, when the insulating layer 820 is wet etched until the gate electrode 870 is exposed, the insulating layer 820 is left under the source electrode 831 and the drain electrode 832, and a through-hole 825 is formed under the amorphous material layer 850. Accordingly, the amorphous material layer 850 and the heater layer 840 have a bridge shape connecting the source electrode 831 and the drain electrode 832.

Figure 26A:
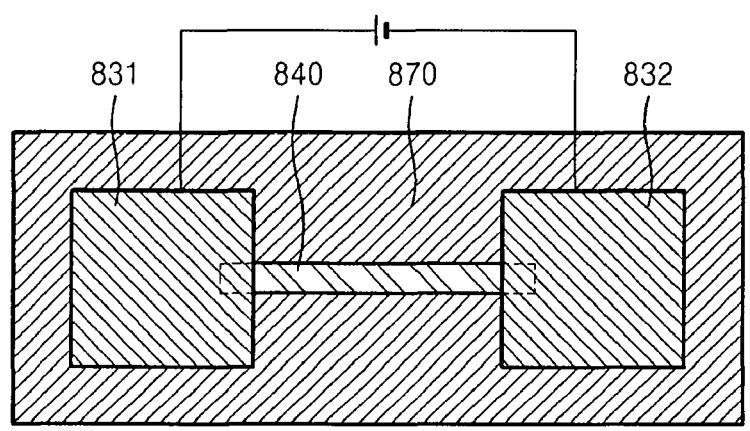
Figure 26B:
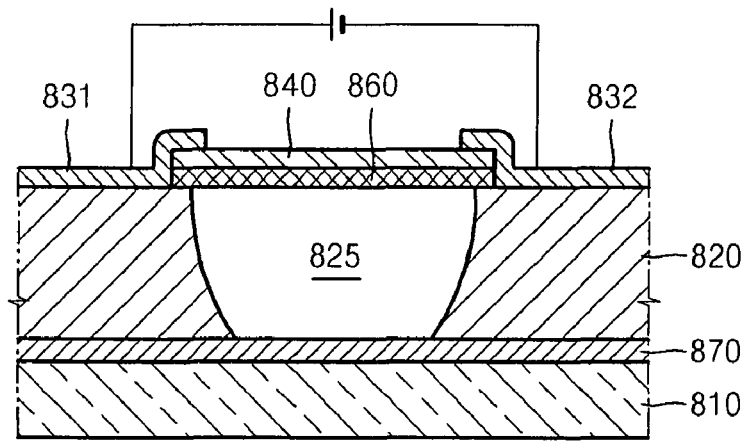

Referring to FIGS. 26A and 26B, when the heater layer 840 is heated at a predetermined temperature by applying a predetermined voltage between the source electrode 831 and the drain electrode 832, the amorphous material layer 850 formed on a bottom surface of the heater layer 840 is crystallized into a polysilicon layer 860. The heater layer 840 may be heated at a temperature of approximately 600° C. or more. In this case, since only the amorphous material layer 850 formed on the heater layer 840 is heated, the substrate 810 can be maintained at a temperature of 200° C. or less. While a DC voltage is shown as being applied between the source electrode 831 and the drain electrode 832 in FIGS. 26A and 26B, the present embodiment is not limited thereto, and an AC voltage or a pulse voltage may be applied between the source electrode 831 and the drain electrode 832.

Figure 27A:
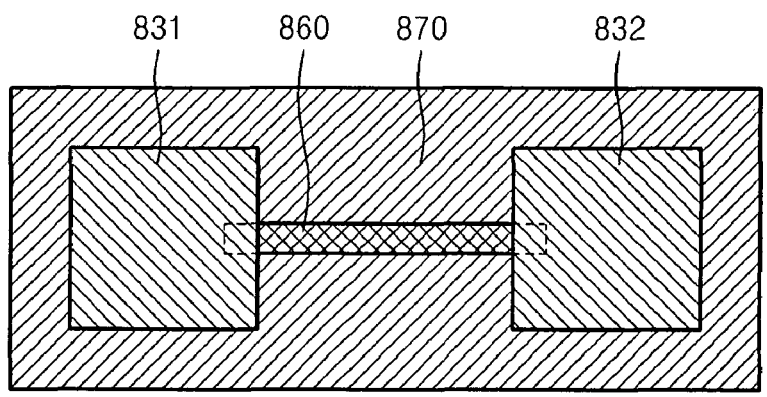
Figure 27B:
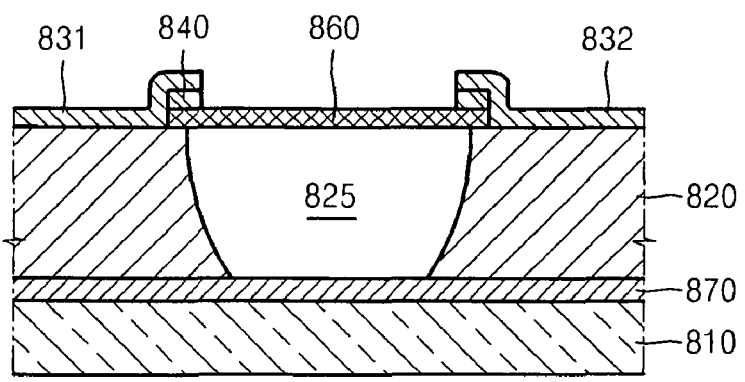

Referring to FIGS. 27A and 27B, an exposed portion of the heater layer 840 is etched and removed. In the etching of the heater layer 840, since the heater layer 840 is formed of a material having etch selectivity, only the heater layer 840 can be selectively etched by the predetermined etching solution. A TFT can be completed through the above processes. Air present in the through-hole 825 forms a gate insulating layer.

Figure 28:
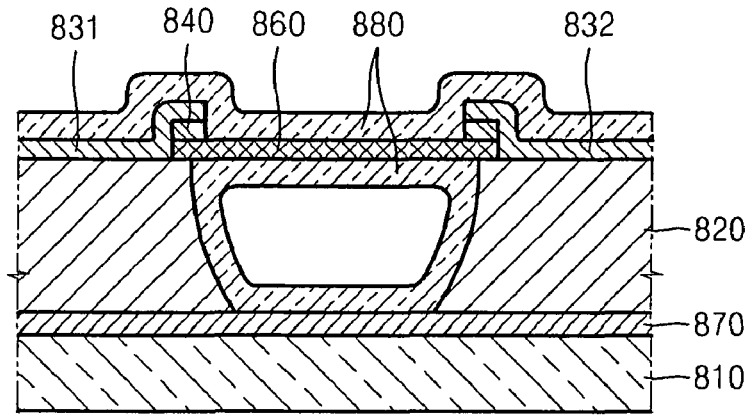

A process shown in FIG. 28 may be added to the present embodiment. That is, referring to FIG. 28, an oxide layer 880 is formed on an entire surface of the structure of FIGS. 27A and 27B. Accordingly, the oxide layer 880 is also formed on an inner wall of the through-hole 825 under the polysilicon layer 860 so that the oxide layer 880 and the air present in the through-hole 825 surrounded by the oxide layer 880 form a gate insulating layer. Alternatively, the oxide layer 880 may be formed to fill the through-hole 825 under the polysilicon layer 860. In this case, the oxide layer 880 filling the through-hole 825 forms a gate insulating layer.

FIGS. 29A thru 31 illustrate a method of fabricating a TFT according to another embodiment of the present invention.

Figure 29A:
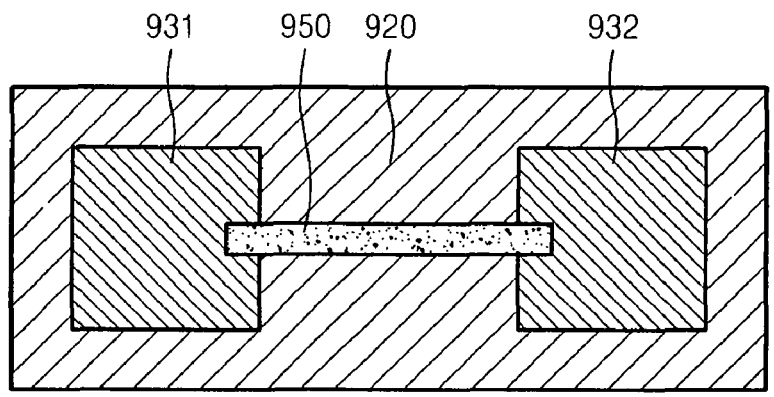
FIGS. 29A thru 31 illustrate a method of fabricating a TFT according to another embodiment of the present invention.
Figure 29B:
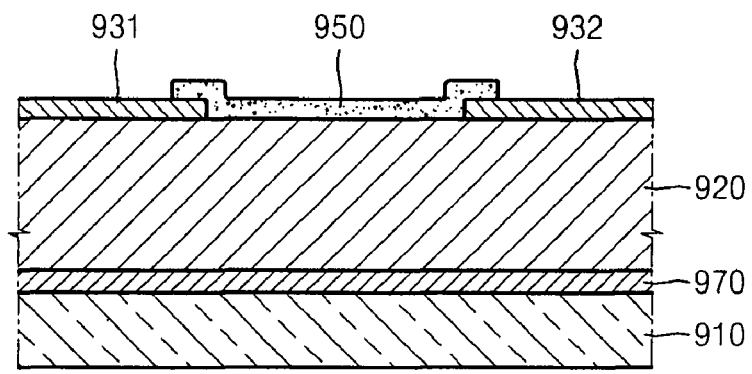

Referring to FIGS. 29A and 29B, a substrate 910 is first prepared, and then a gate electrode 970 is formed on a top surface of the substrate 910. An insulating layer 920 is formed on a top surface of the gate electrode 970, and then a source electrode 931 and a drain electrode 932 are formed on a top surface of the insulating layer 920. Since the substrate 910, the gate electrode 970, the insulating layer 920, the source electrode 931 and the drain electrode 932 are the same as those already described above, a detailed explanation thereof will not be given. Next, an amorphous material layer 950 containing silicon is formed on the top surface of the insulating layer 920 so as to connect the source electrode 931 and the drain electrode 932. The amorphous material layer 950 may be formed of amorphous silicon or amorphous silicon carbide. The amorphous material layer 950 may be formed by depositing an amorphous material containing silicon on the top surface of the insulating layer 920 on which the source electrode 931 and the drain electrode 932 are placed, and then patterning the deposited amorphous material into a predetermined shape. While one amorphous material layer 950 is shown as being formed in FIGS. 29A and 29B, the present embodiment is not limited thereto, and a plurality of amorphous material layers 950 may be formed to connect the source electrode 931 and the drain electrode 932.

Figure 30A:
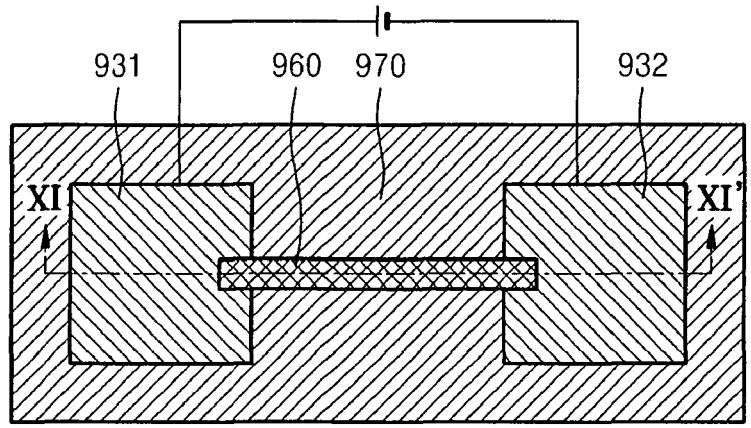
Figure 30B:
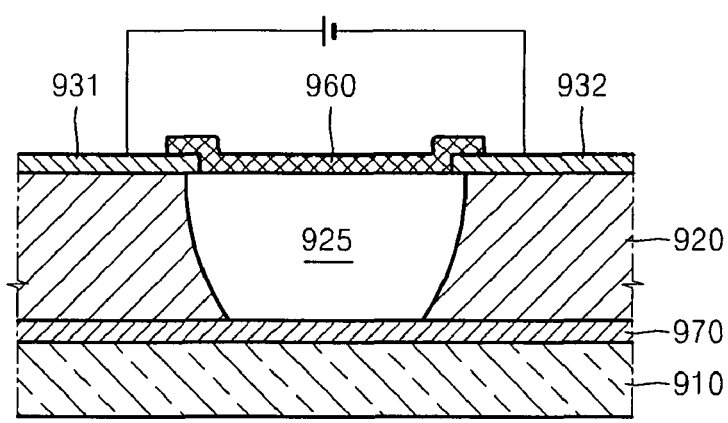

Referring to FIG. 30B, which is a cross-sectional view taken along line XI-XI' of FIG. 30A, when the insulating layer 920 is wet etched until the gate electrode 970 is exposed, the insulating layer 920 is left under the source electrode 931 and the drain electrode 932, and a through-hole 925 is formed under the amorphous material layer 950. Accordingly, the amorphous material layer 950 has a bridge shape connecting the source electrode 931 and the drain electrode 932. Next, when a predetermined voltage is applied between the source electrode 931 and the drain electrode 932, the amorphous material layer 950 is heated at a predetermined temperature, and thus the amorphous material layer 950 is crystallized into a polysilicon layer 960. The amorphous material layer 950 may be heated at a temperature of approximately 600° C. or more. In this case, since only the amorphous material layer 950 is heated, the substrate 910 can be maintained at a temperature of 200° C. or less. While a DC voltage is shown as being applied between the source electrode 931 and the drain electrode 932 in FIGS. 30A and 30B, the present embodiment is not limited thereto, and an AC voltage or a pulse voltage may be applied between the source electrode 931 and the drain electrode 932.

While the source electrode 931 and the drain electrode 932 are first formed on the top surface of the insulating layer 920, and then the amorphous material layer 950 is formed to connect the source electrode 931 and the drain electrode 932 in FIGS. 29A thru 30B, the amorphous material layer 950 may be first formed on the top surface of the insulating layer 920, and then the source electrode 931 and the drain electrode 932, each connected to a respective end of the amorphous material layer 950, may be formed. A TFT is completed through the above processes. Air present in the through-hole 925 forms a gate insulating layer.

Figure 31:
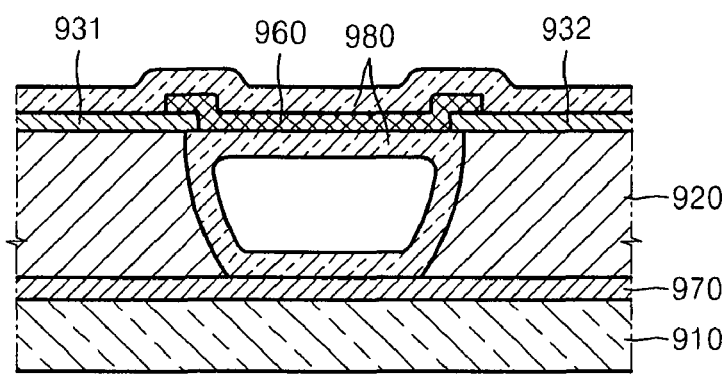

A process shown in FIG. 31 maybe added to the present embodiment. That is, referring to FIG. 31, an oxide layer 980 is formed on an entire surface of the structure of FIGS. 30A and 30B. Accordingly, the oxide layer 980 is also formed on an inner wall of the through-hole 925 under the polysilicon layer 960 so that the oxide layer 980 and the air present in the through-hole 925 surrounded by the oxide layer 980 form a gate insulating layer. Alternatively, the oxide layer 980 may be formed to fill the through-hole 925 under the polysilicon layer 960. In this case, the oxide layer 980 filling the through-hole forms a gate insulating layer.

FIGS. 32A thru 36 illustrate a method of fabricating a TFT according to another embodiment of the present invention.

Figure 32A:
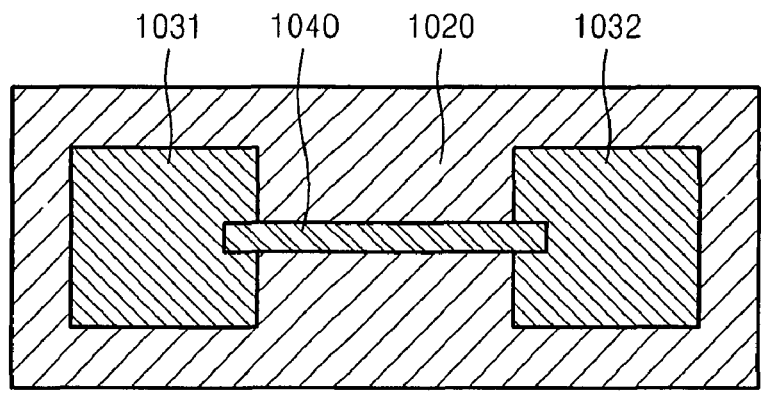
FIGS. 32A thru 36 illustrate a method of fabricating a TFT according to another embodiment of the present invention.
Figure 32B:
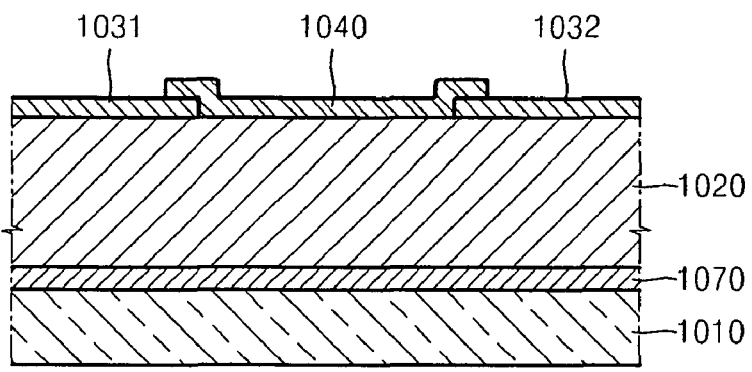

Referring to FIGS. 32A and 32B, a substrate 1010 is first prepared, and then a gate electrode 1070 is formed on a top surface of the substrate 1010. An insulating layer 1020 is formed on a top surface of the gate electrode 1070, and then a source electrode 1031 and a drain electrode 1032 are formed on a top surface of the insulating layer 1020. Since the substrate 1010, the gate electrode 1070, the insulating layer 1020, the source electrode 1031, and the drain electrode 1032 are the same as those already described above, a detailed explanation thereof will not be given. Next, a heater layer 1040 is formed on the top surface of the insulating layer 1020 so as to connect the source electrode 1031 and the drain electrode 1032. The heater layer 1040 may be formed of a material such that only the heater layer 1040 can be selectively etched by a predetermined etching solution in a subsequent etching process. For example, the heater layer 1040 may be formed of at least one selected from the group consisting of W, Mo, SiC, $ZrO_2$, $MoSi_2$, and NiCr. The heater layer 1040 may be formed by depositing a heater material on the top surface of the insulating layer 1020 on which the source electrode 1031 and the drain electrode 1032 are placed, and then patterning the deposited heater material into a predetermined shape. While one heater layer 1040 is shown in FIGS. 32A and 32B, the present embodiment is not limited thereto, and two or more heater layers 1040 may be formed to connect the source electrode 1031 and the drain electrode 1032.

Figure 33A:
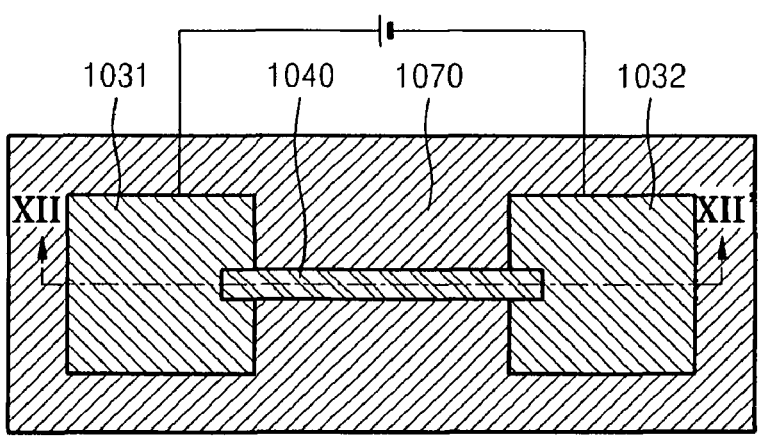
Figure 33B:
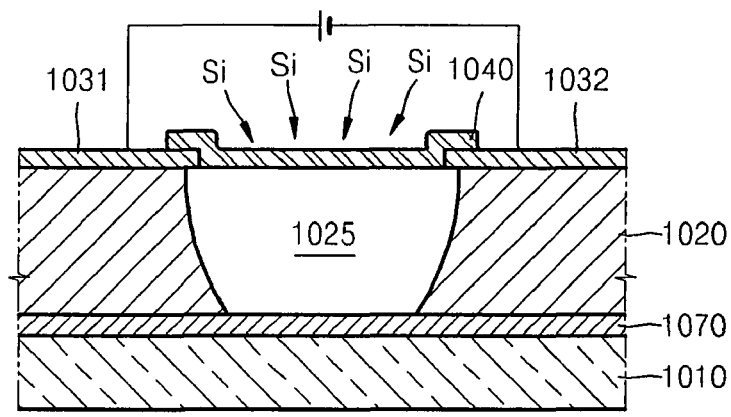
Figure 34A:
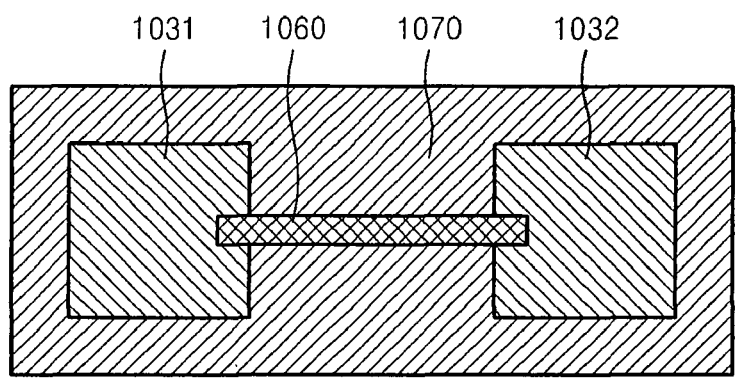
Figure 34B:
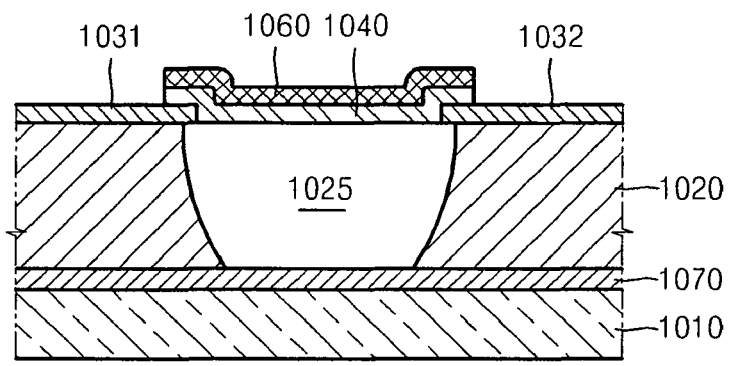

Referring to FIG. 33B, which is a cross-sectional view taken along line XII-XII' of FIG. 33A, when the insulating layer 1020 is wet etched until the gate electrode 1070 is exposed, the insulating layer 1020 is left under the source electrode 1031 and the drain electrode 1032, and a through-hole 1025 is formed under the heater layer 1040. Accordingly, the heater layer 1040 has a bridge shape connecting the source electrode 1031 and the drain electrode 1032. Next, the heater layer 1040 is heated at a predetermined temperature by applying a predetermined voltage between the source electrode 1031 and the drain electrode 1032. The heater layer 1040 may be heated at a temperature of approximately 600° C. or more. While a DC voltage is shown as being applied between the source electrode 1031 and the drain electrode 1032 in FIGS. 33A and 33B, the present embodiment is not limited thereto, and an AC voltage or a pulse voltage may be applied between the source electrode 1031 and the drain electrode 1032. In the state where the heater layer 1040 is heated, when silicon is deposited on the heater layer 1040 by CVD (e.g., LPCVD) using a silane gas as a source gas, a polysilicon layer 1060 is formed on the heater layer 1040 as shown in FIGS. 34A and 34B.

Figure 35A:
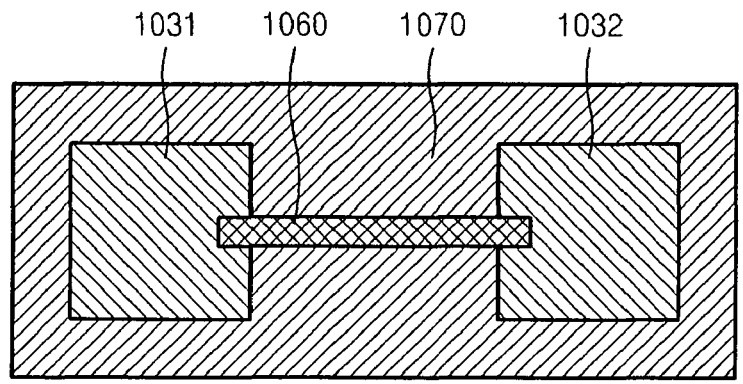
Figure 35B:
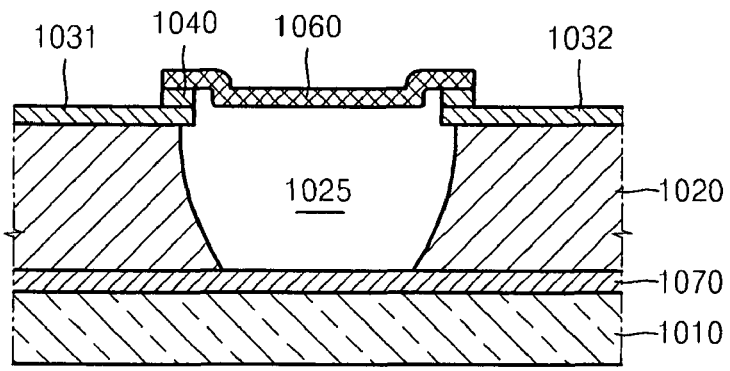

Next, referring to FIGS. 35A and 35B, an exposed portion of the heater layer 1040 is etched and removed. In the etching of the heater layer 1040, since the heater layer 1040 is formed of a material having etch selectivity, only the heater layer 1040 can be selectively etched by the predetermined etching solution.

While the source electrode 1031 and the drain electrode 1032 are first formed on the top surface of the insulating layer 1020, and then the heater layer 1040 is formed to connect the source electrode 1031 and the drain electrode 1032 in FIGS. 32A thru 35B, the heater layer 1040 may be first formed on the top surface of the insulating layer 1020, and then the source electrode 1031 and the drain electrode 1032, each connected to a respective end of the heater layer 1040, may be formed. A TFT is completed through the above processes. Air present in the through-hole 1025 forms a gate insulating layer.

Figure 36:
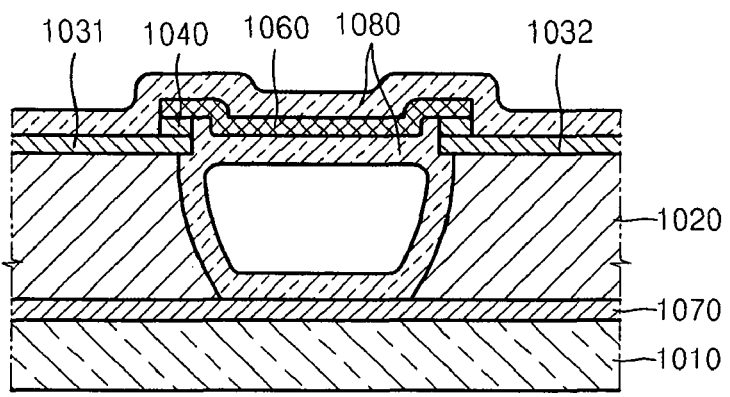

A process shown in FIG. 36 may be added to the present embodiment. That is, referring to FIG. 36, an oxide layer 1080 is formed on an entire surface of the structure of FIGS. 35A and 35B. Accordingly, the oxide layer 1080 is also formed on an inner wall of the through-hole 1025 under the polysilicon layer 1060, such that the oxide layer 1080 and the air present in the through-hole 1025 surrounded by the oxide layer 1080 form a gate insulating layer. Alternatively, the oxide layer 1080 may be formed to fill the through-hole 1025 under the polysilicon layer 1060. In this case, the oxide layer 1080 filling the through-hole 1025 forms a gate insulating layer.

As described above, since only the amorphous silicon layer and/or the heater layer connecting the source electrode and the drain electrode are/is selectively heated to form the polysilicon layer, even though the substrate is a glass substrate, the risk that the glass substrate may be deformed by high temperature can be avoided.

As also described above, since the amorphous material layer and/or the bridge-shaped heater layer connecting the electrodes are/is selectively heated to form the polysilicon layer, the substrate can be maintained at a low temperature of 200° C. or less. Accordingly, the TFT can be easily fabricated without deformation of the substrate, even though the substrate is a glass substrate which is generally used in liquid crystal displays (LCDs) or organic light emitting diodes (OLEDs). Moreover, the TFT can be applied to large-area display devices, such as OLEDs or LCDs.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A method of fabricating a thin film transistor, the method comprising the steps of:
    sequentially forming a gate electrode and an insulating layer on a substrate;
    forming at least one amorphous material layer containing silicon on the insulating layer;
    forming a heater layer on said at least one amorphous material layer;
    forming a source electrode and a drain electrode, each connected to a respective end of the heater layer on the insulating layer;
    forming a through-hole under said at least one amorphous material layer by etching the insulating layer;
    crystallizing said at least one amorphous material layer into at least one polysilicon layer by applying a voltage between the source electrode and the drain electrode so as to heat the heater layer; and
    etching and removing an exposed portion of the heater layer.

2. The method of claim 1, further comprising the step, after the removing of the exposed portion of the heater layer, of forming an oxide layer on an inner wall of the through-hole.

3. The method of claim 1, further comprising the step, after the removing of the exposed portion of the heater layer, of forming an oxide layer filling the through-hole.

4. The method of claim 1, wherein said at-least one amorphous material layer is formed of one of amorphous silicon and amorphous silicon carbide.

5. The method of claim 1, wherein the heater layer is formed of at least one selected from the group consisting of W, Mo, SiC, $ZrO_2$, $MoSi_2$, and NiCr.

6. The method of claim 1, wherein the through-hole is formed by wet etching the insulating layer until the gate electrode is exposed.

7. The method of claim 1, wherein the heater layer is heated at a temperature of at least 600° C.

* * * * *